US010340395B2

(12) United States Patent
Li et al.

(10) Patent No.: US 10,340,395 B2
(45) Date of Patent: Jul. 2, 2019

(54) SEMICONDUCTOR VARIABLE CAPACITOR USING THRESHOLD IMPLANT REGION

(71) Applicant: QUALCOMM Incorporated, San Diego, CA (US)

(72) Inventors: Xia Li, San Diego, CA (US); Fabio Alessio Marino, San Marcos, CA (US); Qingqing Liang, San Diego, CA (US); Francesco Carobolante, San Diego, CA (US); Seung Hyuk Kang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/583,289

(22) Filed: May 1, 2017

(65) Prior Publication Data

US 2018/0315864 A1   Nov. 1, 2018

(51) Int. Cl.
*H01L 29/06*  (2006.01)
*H01L 29/93*  (2006.01)
(Continued)

(52) U.S. Cl.
CPC .......... *H01L 29/93* (2013.01); *H01L 29/0649* (2013.01); *H01L 29/66174* (2013.01); *H01L 29/94* (2013.01); *H01L 29/36* (2013.01)

(58) Field of Classification Search
CPC ............. H01L 29/1083; H01L 29/0634; H01L 29/7816; H01L 29/7833; H01L 29/7393;
(Continued)

(56) References Cited

U.S. PATENT DOCUMENTS 5,498,554 A * 3/1996 Mei .................. H01L 27/088
257/E27.064
5,874,768 A * 2/1999 Yamaguchi ......... H01L 27/1203
257/339
(Continued)

FOREIGN PATENT DOCUMENTS

GB        2451116 A    1/2009

OTHER PUBLICATIONS

International Search Report and Written Opinion—PCT/US2018/026434—ISA/EPO—dated Jul. 6, 2018.

*Primary Examiner* — Mary A Wilczewski
*Assistant Examiner* — Tsz K Chiu
(74) *Attorney, Agent, or Firm* — Patterson & Sheridan, L.L.P.

(57) ABSTRACT

Certain aspects of the present disclosure generally relate to a semiconductor variable capacitor, and techniques for fabricating the same, implemented using a threshold voltage implant region. For example, the semiconductor variable capacitor generally includes a first non-insulative region disposed above a first semiconductor region, a second non-insulative region disposed above the first semiconductor region, and a threshold voltage (Vt) implant region interposed between the first non-insulative region and the first semiconductor region and disposed adjacent to the second non-insulative region. In certain aspects, the semiconductor variable capacitor also includes a control region disposed above the first semiconductor region such that a capacitance between the first non-insulative region and the second non-insulative region is configured to be adjusted by varying a control voltage applied to the control region.

28 Claims, 37 Drawing Sheets

(51) Int. Cl.
*H01L 29/66* (2006.01)
*H01L 29/94* (2006.01)
*H01L 29/36* (2006.01)

(58) Field of Classification Search
CPC ............ H01L 29/0653; H01L 29/7835; H01L 29/0692; H01L 29/402; H01L 29/0619; H01L 29/1045
See application file for complete search history.

(56) References Cited

U.S. PATENT DOCUMENTS

| | | | |
|---|---|---|---|
| 7,074,681 B2 * | 7/2006 | de Fresart | H01L 29/0653 257/E29.012 |
| 7,238,986 B2 * | 7/2007 | Pendharkar | H01L 29/0847 257/336 |
| 7,821,078 B2 * | 10/2010 | Amishiro | H01L 27/0207 257/379 |
| 8,159,029 B2 * | 4/2012 | Su | H01L 21/26586 257/343 |
| 8,273,616 B2 | 9/2012 | Chen et al. | |
| 8,530,287 B2 | 9/2013 | Cai et al. | |
| 8,703,568 B2 | 4/2014 | Babcock et al. | |
| 8,772,871 B2 * | 7/2014 | Yang | H01L 29/0653 257/344 |
| 8,809,964 B2 | 8/2014 | Andrieu et al. | |
| 9,356,043 B1 | 5/2016 | Sakakibara et al. | |
| 9,362,399 B2 | 6/2016 | Hung et al. | |
| 9,401,436 B2 | 7/2016 | Marino et al. | |
| 2002/0117720 A1 | 8/2002 | Lee et al. | |
| 2005/0112822 A1 * | 5/2005 | Litwin | H01L 29/0653 438/270 |
| 2008/0197408 A1 * | 8/2008 | Disney | H01L 29/0653 257/335 |
| 2012/0043590 A1 | 2/2012 | Chen et al. | |
| 2012/0205738 A1 * | 8/2012 | Yang | H01L 29/66689 257/335 |
| 2014/0061787 A1 * | 3/2014 | Kim | H01L 29/36 257/339 |
| 2014/0332928 A1 | 11/2014 | Marino et al. | |
| 2014/0367832 A1 * | 12/2014 | Marino | H01L 29/0615 257/597 |

* cited by examiner

SEMICONDUCTOR VARIABLE CAPACITOR USING THRESHOLD IMPLANT REGION

TECHNICAL FIELD

Certain aspects of the present disclosure generally relate to electronic circuits and, more particularly, to variable semiconductor capacitors.

BACKGROUND

Semiconductor capacitors are fundamental components for integrated circuits. A variable capacitor is a capacitor whose capacitance may be intentionally and repeatedly changed under the influence of a bias voltage. A variable capacitor, which may be referred to as a varactor, is often used in inductor-capacitor (LC) circuits to set the resonance frequency of an oscillator, or as a variable reactance, e.g., for impedance matching in antenna tuners.

A voltage-controlled oscillator (VCO) is an example circuit that may use a varactor in which the thickness of a depletion region formed in a p-n junction diode is varied by changing a bias voltage to alter the junction capacitance. Any junction diode exhibits this effect (including p-n junctions in transistors), but devices used as variable capacitance diodes are designed with a large junction area and a doping profile specifically chosen to improve the device performance, such as quality factor and tuning range.

SUMMARY

Certain aspects of the present disclosure generally relate to a semiconductor variable capacitor, and techniques for fabricating the same, implemented using a threshold voltage implant region.

Certain aspects of the present disclosure provide a semiconductor variable capacitor. The semiconductor variable capacitor generally includes a first non-insulative region disposed above a first semiconductor region, a second non-insulative region disposed above the first semiconductor region, a threshold voltage (Vt) implant region interposed between the first non-insulative region and the first semiconductor region and disposed adjacent to the second non-insulative region, and a control region disposed above the first semiconductor region such that a capacitance between the first non-insulative region and the second non-insulative region is configured to be adjusted by varying a control voltage applied to the control region.

Certain aspects of the present disclosure provide a semiconductor variable capacitor. The semiconductor variable capacitor generally includes a first non-insulative region disposed above a first semiconductor region, a second non-insulative region disposed above the first semiconductor region, a Vt implant region interposed between the first non-insulative region and the first semiconductor region and disposed adjacent to the second non-insulative region, and a control region disposed above a second semiconductor region such that a capacitance between the first non-insulative region and the second non-insulative region is configured to be adjusted by varying a control voltage applied to the control region.

Certain aspects of the present disclosure provide a method for fabricating a semiconductor variable capacitor. The method generally includes forming a first non-insulative region above a first semiconductor region, forming a second non-insulative region above the first semiconductor region, forming a Vt implant region interposed between the first non-insulative region and the first semiconductor region and adjacent to the second non-insulative region, and forming a control region above a second semiconductor region such that a capacitance between the first non-insulative region and the second non-insulative region is configured to be adjusted by varying a control voltage applied to the control region.

Certain aspects of the present disclosure provide a method for fabricating a semiconductor variable capacitor. The method generally includes forming a first non-insulative region above a first semiconductor region, forming a second non-insulative region above the first semiconductor region, forming a Vt implant region interposed between the first non-insulative region and the first semiconductor region and adjacent to the second non-insulative region, and forming a control region above the first semiconductor region such that a capacitance between the first non-insulative region and the second non-insulative region is configured to be adjusted by varying a control voltage applied to the control region.

BRIEF DESCRIPTION OF THE DRAWINGS

So that the manner in which the above-recited features of the present disclosure can be understood in detail, a more particular description, briefly summarized above, may be by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Certain aspects of the present disclosure are generally directed to a semiconductor variable capacitor structure, also referred to as a transcap (TC) device, suitable for integrated circuits. A TC device may have at least three terminals, where the capacitance between two main terminals of the device (C1 and C2) can be varied by changing a voltage applied between a control terminal CTRL and one of the other two main terminals (e.g., C2). Certain aspects of the present disclosure are generally directed to a semiconductor variable capacitor implemented using a threshold voltage (Vt) implant region to improve the capacitor quality factor (Q) and/or decrease the series resistance.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

Figure 1:
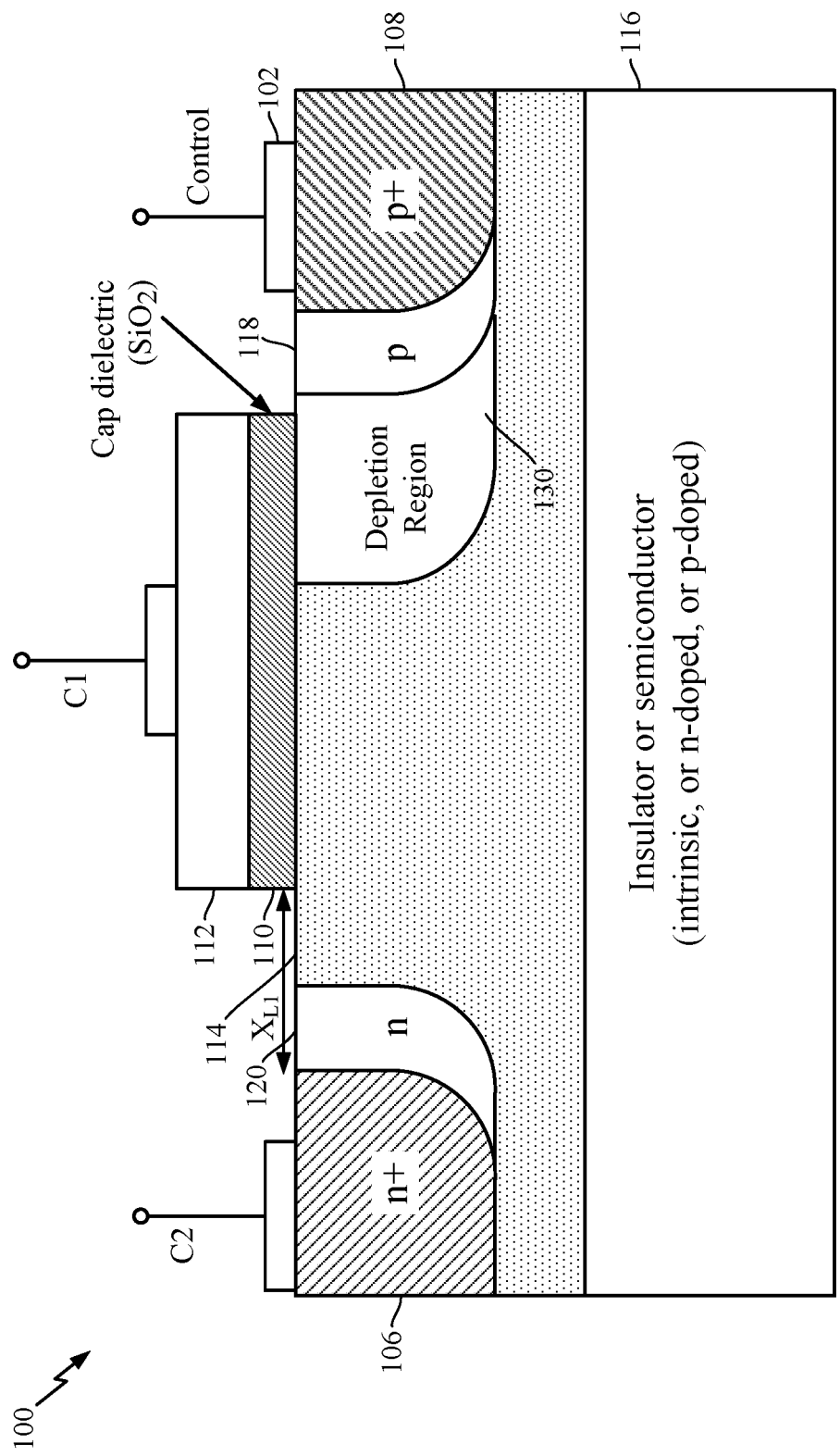
FIG. 1 illustrates a cross-sectional view of an example variable capacitor.

FIG. 1 illustrates a cross-sectional view of an example structure of a TC device 100. Certain implementations of a TC device use an oxide layer 110, which may be similar to oxide gate layers used to fabricate metal-oxide semiconductor (MOS) devices (e.g., thin or thick gate oxide). The oxide layer 110 may isolate the C1 and C2 terminals, and thus, in effect act as a dielectric for the TC device 100. A non-insulative region 106 (e.g., n+ implantation region) and a non-insulative region 108 (e.g., p+ implantation region) may be formed on the two sides of the TC device 100 in order to create p-n junctions. As used herein, a non-insulative region generally refers to a region that may be conductive or semiconductive. A bias voltage may be applied between the control terminal 102 and the C2 terminal in order to modulate the capacitance between terminals C1 and C2. For example, by applying a bias voltage to the control terminal 102, a depletion region 130 may be formed at the p-n junction between the non-insulative region 108 (e.g., control region) and a semiconductor region which may implemented using an n-well (NW) region 114. Based on the bias voltage, this depletion region 130 may widen under the oxide layer 110, reducing the area of the equivalent electrode formed by the NW region 114, and with it, the effective capacitance area and capacitance value of the TC device 100.

The work-function of a non-insulative region 112 above the oxide layer 110 may be chosen to improve the device performance. For example, an n-doped poly-silicon material may be used (instead of p-doped), even if the NW region 114 underneath the oxide layer 110 is doped with n-type impurities. In some aspects, a metallic material (also doped if desired) may be used for the non-insulative region 112 with an opportune work-function or a multi-layer stack of different metallic materials so as to obtain the desired work-function. In certain aspects, non-insulative region 112 may be divided into two sub-regions, one n-doped and one p-doped, or a different metallic material may be used for each sub-region.

In some cases, the NW region 114 may be disposed above an insulator or semiconductor region 116. The type of material for the semiconductor region 116 may be chosen in order to improve the TC device 100 performance. For example, the semiconductor region 116 may be an insulator, a semi-insulator, or an intrinsic/near-intrinsic semiconductor in order to decrease the parasitic capacitances associated with the substrate (not shown). In some cases, the semiconductor region 116 can be made of n-doped or p-doped semiconductor with an appropriate doping profile in order to increase the TC device quality factor and/or the control on the depletion region 130 that may be formed between the non-insulative region 108 and the NW region 114 when applying a bias voltage to the control terminal 102. The semiconductor region 116 can also be formed by multiple semiconductor layers or regions doped in different ways (n, p, or intrinsic). Furthermore, the semiconductor region 116 can include semiconductors, insulating layers, and/or substrates or can be formed above semiconductors, insulating layers, and/or substrates.

To better understand the working principle of the TC device 100, it may be assumed that the control terminal 102 is biased with a negative voltage with respect to the C2 terminal, for example. The width of the depletion region 130 in the NW region 114 may be controlled by applying a control voltage to the control terminal 102. The capacitance between the C1 and C2 terminals may depend on the dimensions of the depletion region 130 in the NW region 114, and thus, can be controlled by applying the control voltage to the control terminal 102. Furthermore, the variation of the bias voltage applied to the control terminal 102 may not alter the DC voltage between the C1 and C2 terminals, allowing for improved control of the device characteristics. If a voltage applied to the C1 terminal is half a voltage applied to the C2 terminal, the voltage difference between the C2 and C1 terminals (or between the C1 terminal and the control terminal 102) may be reduced. The higher voltage of the C2 terminal (e.g., about twice the breakdown voltage of the C1 terminal to the control terminal) allows for an increase in the capacitance range for the TC device 100.

In some cases, it may be preferable to have the non-insulative region 106 and/or non-insulative region 108 a distance away from the oxide layer 110 in order to reduce the parasitic capacitance associated with the non-insulative region 108 and improve the isolation of the non-insulative region 106 for high control voltages. For example, the non-insulative region 106 can be partially overlapped with the oxide layer 110, or the non-insulative region 106 can be formed at a distance from the edge of the oxide layer 110 so as to increase the device tuning range and linearity. In the latter case, the voltage-withstanding capability of the device is increased since a portion of a radio frequency (RF) signal, that may be applied to the C1 and C2 terminals, drops between the oxide edge and the non-insulative region 106 instead of being applied entirely across the oxide layer 110. The non-insulative region 108 can be partially overlapped with the oxide layer 110, or the non-insulative region 108 can be spaced apart so as to reduce the parasitic capacitance between the C1 terminal and the control terminal 102.

A p-doped region 118 can be optionally used to increase the breakdown voltage of the p-n junction between non-insulative region 108 and NW region 114, decreasing, at the same time, the parasitic capacitance between the C1 terminal and the control terminal 102. Similarly, an optional n-doped region 120 can be added between the non-insulative region 106 and NW region 114 in order to regulate the doping concentration between the oxide layer 110 and the non-insulative region 106.

Figure 2:
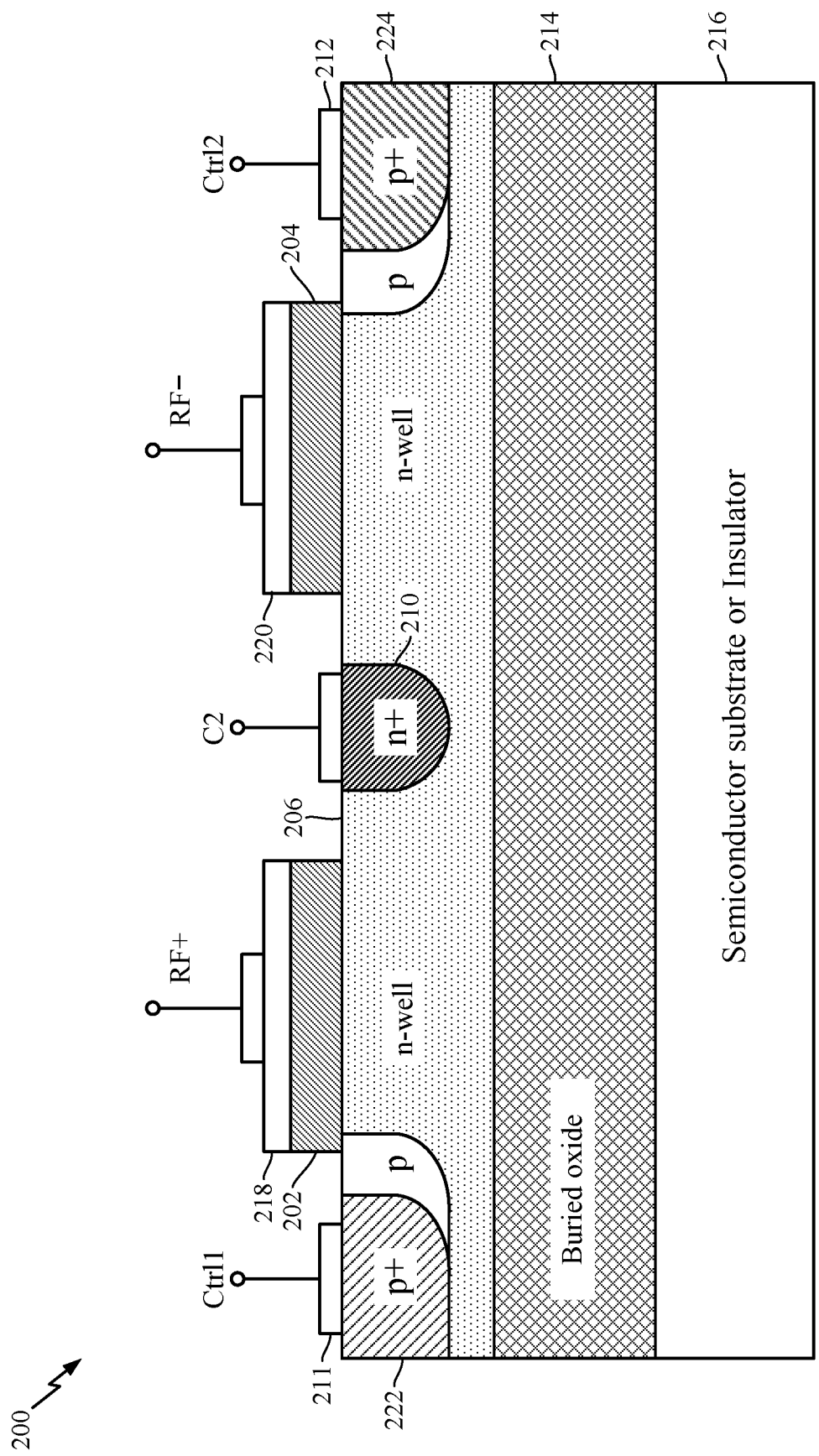
FIG. 2 illustrates a cross-sectional view of an example differential variable capacitor.

FIG. 2 illustrates an example differential TC device 200 in cross section. The differential TC device 200 can be obtained by disposing two of the TC devices 100 back-to-back. In this example, RF+ and RF− terminals (e.g., corresponding to the C1 terminal in FIG. 1) correspond to the positive and negative nodes of a differential RF port for a differential RF signal. The RF+ terminal may be disposed on an oxide layer 202, and the RF− terminal may be disposed on an oxide layer 204. N-well regions 206 and 208 may be coupled to a C2 terminal via a non-insulative region 210 (e.g., n+), as illustrated. A bias voltage may be applied to the control terminals 211 and 212 (or to the C2 terminal with respect to the other terminals of the device) to adjust a depletion region of the n-well region 206, respectively, thereby adjusting the capacitance between respective RF+ and RF− terminals and the C2 terminal. In some aspects, a buried oxide layer 214 may be positioned below the n-well region 206 and above a semiconductor substrate or insulator 216, as illustrated.

In some cases, the retrograde well surface dopant concentration of the transcap device may be low and the series resistance of the TC device may be high. The low dopant concentration and high series resistance of the TC device adversely impacts the TC's quality factor (Q). Moreover, the fabrication process of the TC device may be complex and incompatible with complementary metal-oxide semiconductor (CMOS) fabrication processes.

Certain aspects of the present disclosure are directed to techniques for increasing the Q and/or reducing the series resistance of a semiconductor variable capacitor (e.g., a TC device) by incorporating a threshold voltage (Vt) implant region in a channel of the semiconductor variable capacitor.

Figure 68:
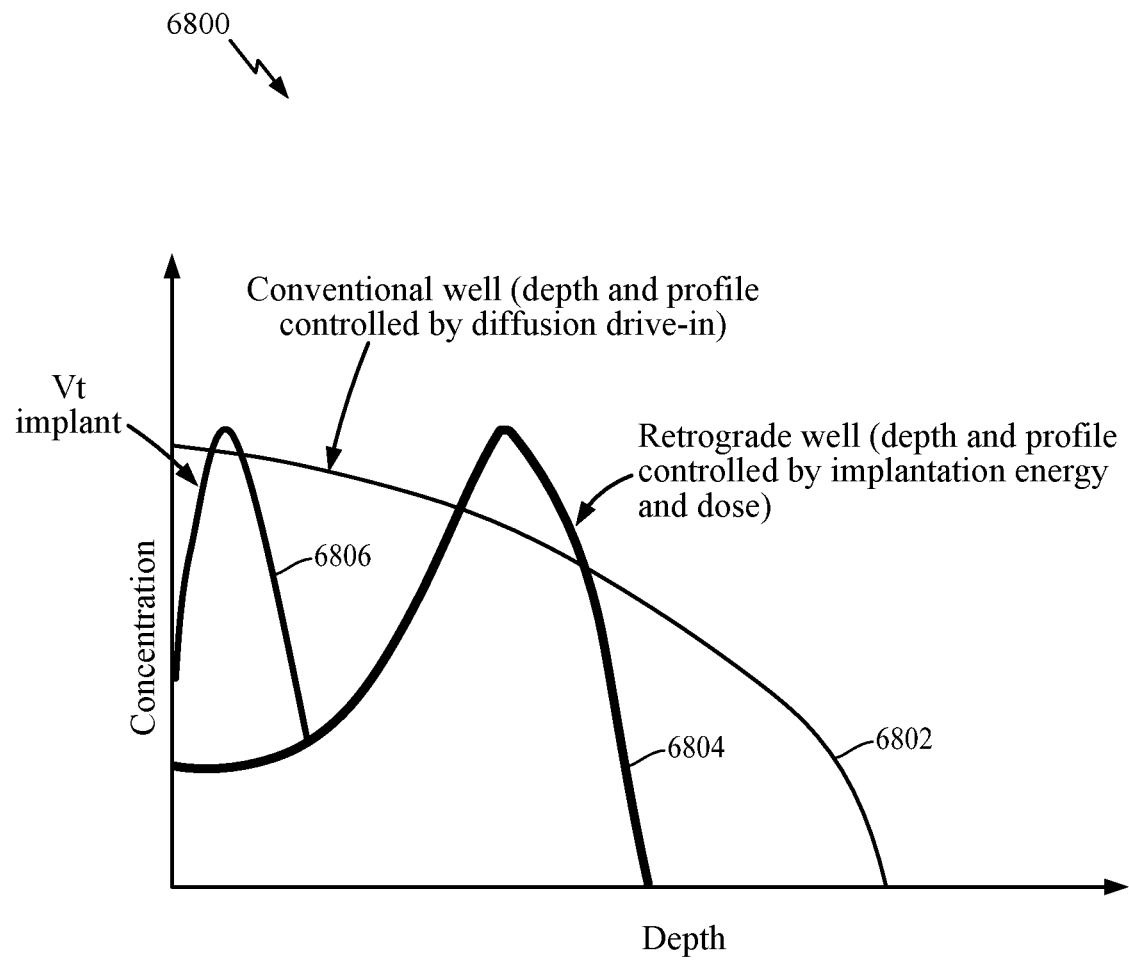
FIG. 68 is a graph illustrating example well doping concentration profiles, in accordance with certain aspects of the present disclosure.

FIG. 68 is a graph 6800 illustrating example well doping concentration profiles, in accordance with certain aspects of the present disclosure. The doping concentration profile 6802 of a conventional well is controlled by diffusion drive-in, as opposed to the doping concentration 6804 of a retrograde well that is controlled by implantation energy and dose. As illustrated, the well doping concentration peak of the retrograde well is at the bottom of the well. Aspects of the present disclosure incorporate a Vt implant region, shifting the doping concentration of the retrograde well towards the surface of the well, as illustrated by the doping concentration profile 6806, reducing the series resistance of the TC device.

Figure 3:
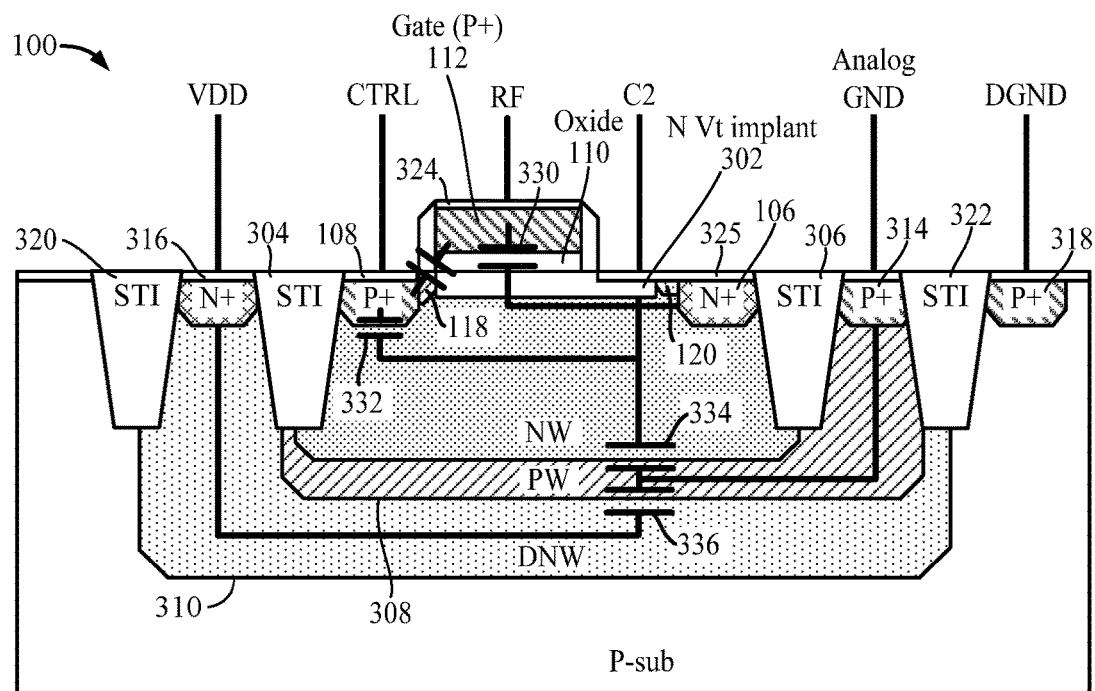
FIG. 3 illustrates the variable capacitor of FIG. 1 implemented with a threshold voltage implant region, in accordance with certain aspects of the present disclosure.

FIG. 3 illustrates the TC device 100 of FIG. 1 implemented with a Vt implant region 302 (e.g., n-doped), in accordance with certain aspects of the present disclosure. The Vt implant region 302 may be disposed in a channel between the control region 108 and the non-insulative region 106. In certain aspects, the Vt implant region may be a layer of dopant that reduces the channel resistance of the TC device 300 and improves the quality factor (Q) of the TC device 300.

The TC device 100 of FIG. 3 is implemented using a CMOS-compatible retrograde well (e.g., NW region 114). In certain aspects, the control region 108 and non-insulative region 106 may be disposed above the NW region 114. The control region 108 may be disposed adjacent to a shallow trench isolation (STI) region 304, and the non-insulative region 106 may be disposed adjacent to an STI region 306. The NW region 114 may be disposed above a p-well (PW) region 308, a deep NW (DNW) region 310, and a p-doped substrate (p-sub) region 312, as illustrated.

The PW region 308 may be coupled to analog ground (GND) (e.g., reference potential for analog circuitry) through a non-insulative region 314, the DNW region 310 may be coupled to a voltage rail VDD (e.g., power supply node) through a non-insulative region 316, and the p-sub region 312 may be coupled to a digital GND (DGND) (e.g., reference potential for digital circuitry) through a non-insulative region 318. Thus, the DNW region 310 isolates the analog GND from the DGND, preventing noise coupling between analog and digital circuitry components.

As illustrated, an STI region 320 may be disposed adjacent to non-insulative region 316, and an STI region 322 may be disposed between the non-insulative region 314 and the non-insulative region 318. As illustrated, the C2 terminal is close to the non-insulative region 112 (gate), reducing series resistance of the TC device 100. For example, the C2 terminal may lie adjacent to the silicide layer 325 and be disposed above a portion of the Vt implant region 302. Moreover, as illustrated, a silicide layer 324 may be disposed over the active and gate layers.

In FIG. 3, the capacitance between the non-insulative region 112 and the non-insulative region 106 (e.g., the capacitance of the TC device 100) is represented by the capacitor 330. Moreover, the capacitance between the control region 108 and the NW region 114 is represented by capacitor 332, the capacitance between the NW region 114 and the PW region 308 is represented by capacitor 334, and the capacitance between the PW region 308 and the DNW region 310 is represented by capacitor 336.

Figure 4:
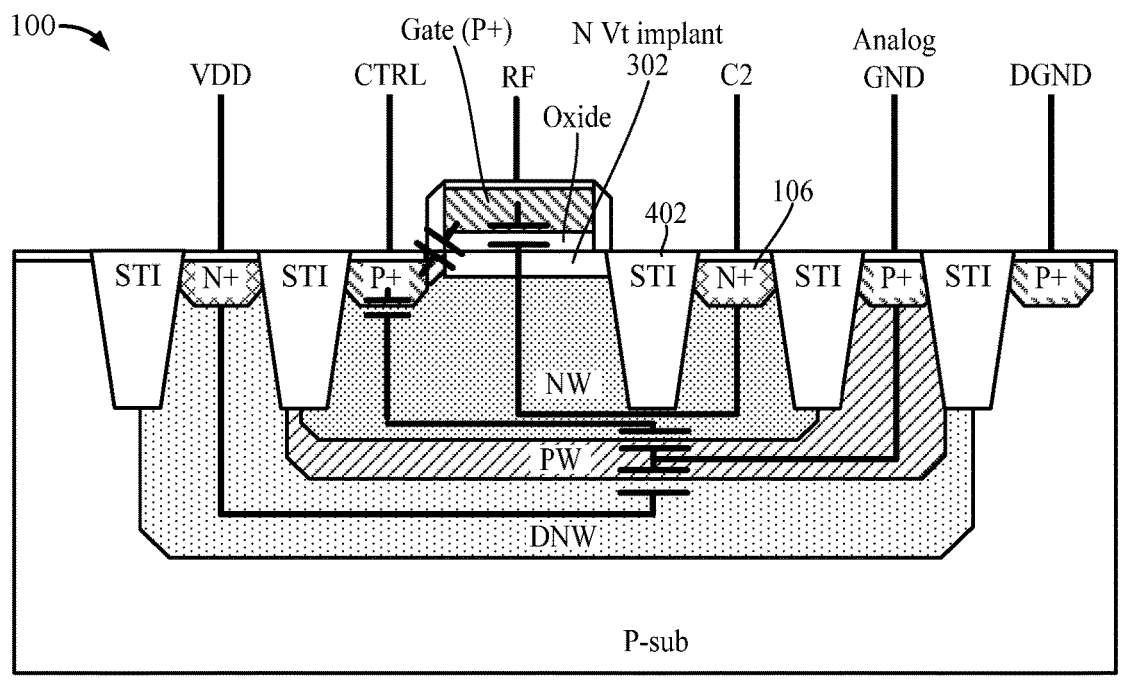
FIG. 4 illustrates the variable capacitor of FIG. 3 implemented with an extra shallow trench isolation (STI) region, in accordance with certain aspects of the present disclosure.

FIG. 4 illustrates the TC device 100 of FIG. 3 implemented with an extra STI region 402, in accordance with certain aspects of the present disclosure. In this case, the STI region 402 is disposed between the non-insulative region 106 and the Vt implant region. Adding the STI region 402 increases the voltage rating of the TC device 100 of FIG. 4, as compared to the TC device 100 of FIG. 3.

Figure 5:
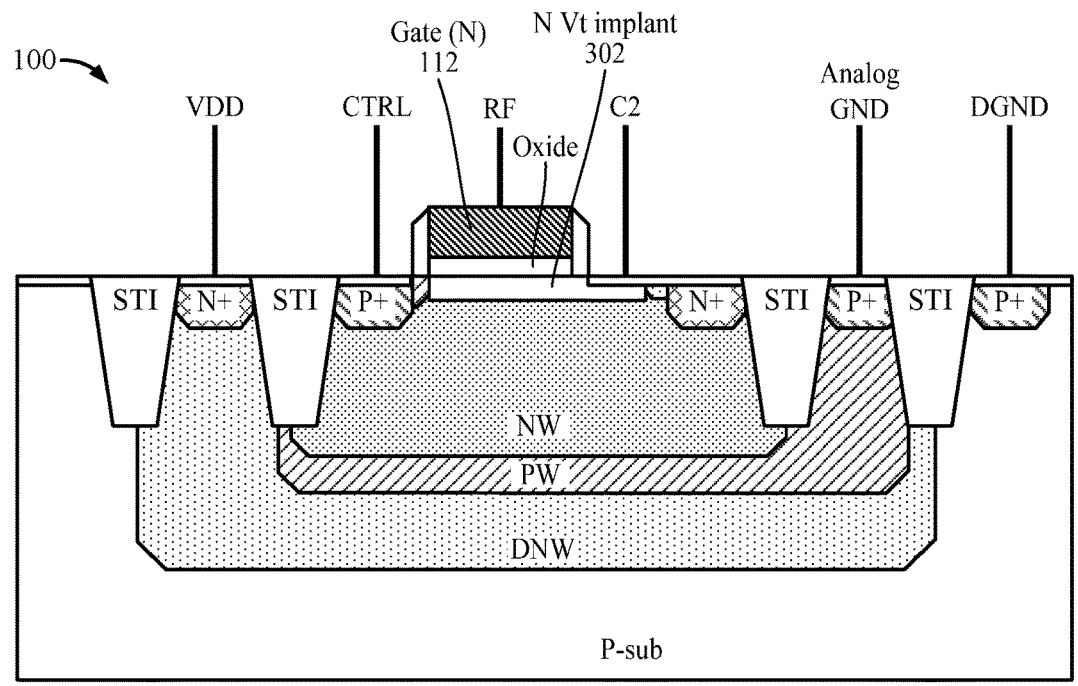
FIGS. 5 and 6 illustrate the variable capacitor of FIGS. 3 and 4, respectively, implemented with an n-doped gate region, in accordance with certain aspects of the present disclosure.
Figure 6:
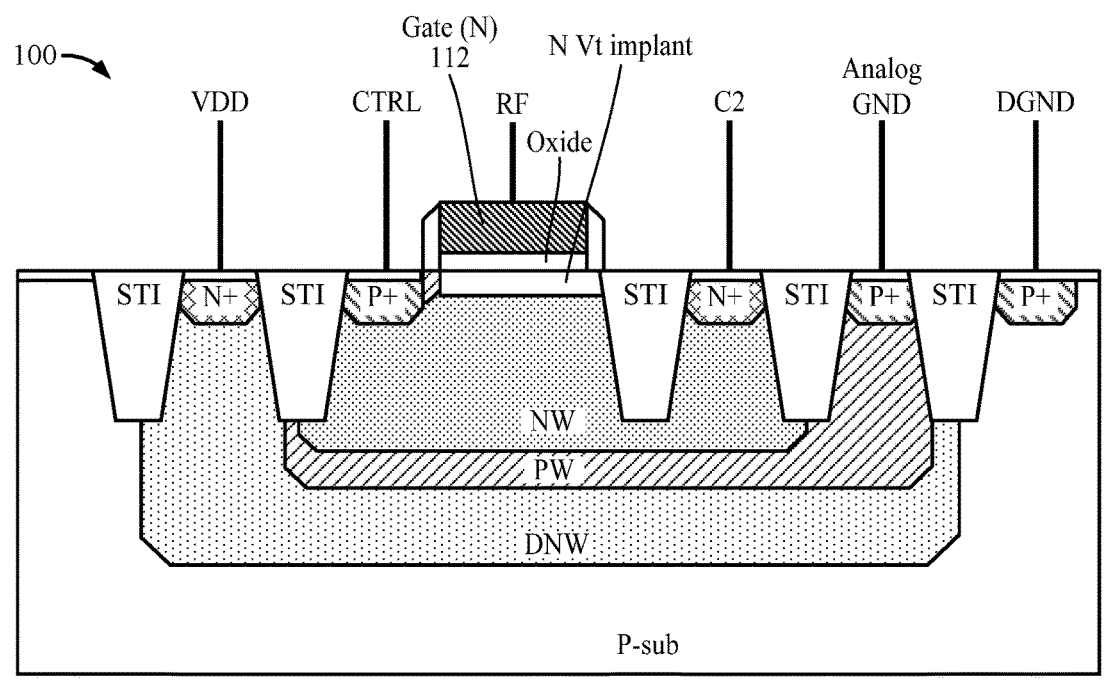

FIGS. 5 and 6 illustrate the TC device 100 of FIGS. 3 and 4, respectively, implemented with an n-doped or n-type metal non-insulative region 112 (gate region), in accordance with certain aspects of the present disclosure. Using an n-type gate region reduces the gate and silicon depletion (e.g., for n-type high-k (HK)/metal gate (MG)).

Figure 7:
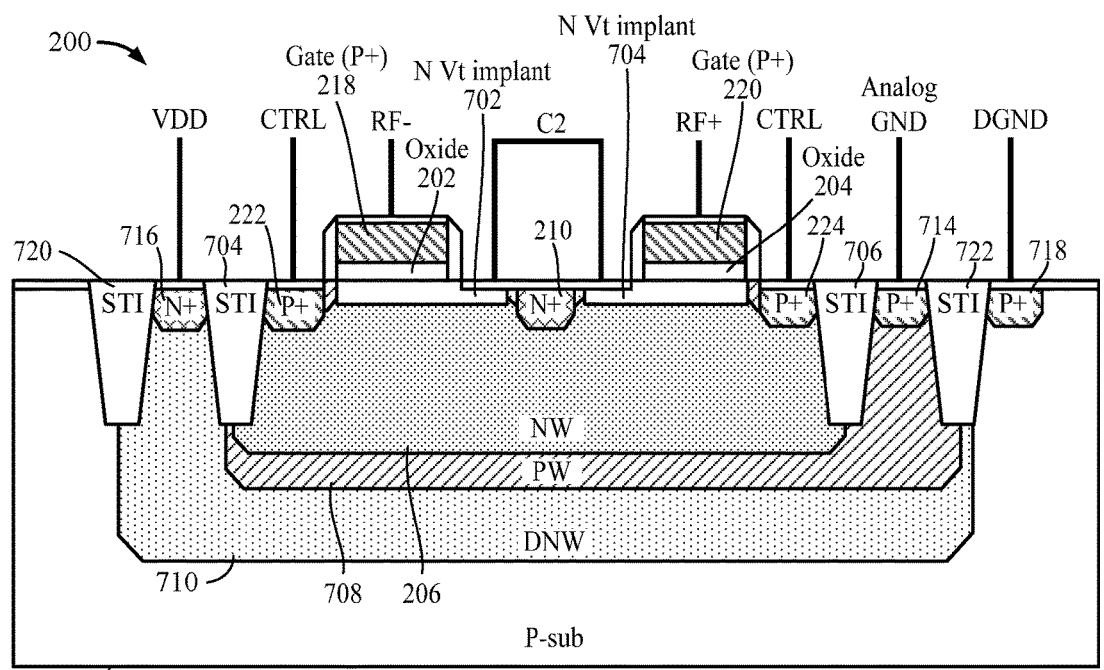
FIG. 7 illustrates the example differential variable capacitor of FIG. 2 implemented with multiple threshold voltage implant regions, in accordance with certain aspects of the present disclosure.

FIG. 7 illustrates the example differential TC device 200 of FIG. 2 implemented with multiple Vt implant regions 702 and 704, in accordance with certain aspects of the present disclosure. For example, the Vt implant region 702 is coupled between the control region 222 and non-insulative region 210, and the Vt implant region 704 is coupled between the control region 224 and the non-insulative region 210. While a single non-insulative region 210 is used for the C2 terminal in the example differential TC device 200 of FIG. 7 to reduce cell size, multiple non-insulative regions (e.g., shorted together) may be used in some cases.

Similar to the TC device 100 of FIG. 3, the NW region 206 may be disposed above a p-well (PW) region 708, a deep NW (DNW) region 710, and a p-doped substrate (p-sub) region 712. The PW region 708 may be coupled to analog ground (GND) (e.g., reference potential for analog circuitry) through a non-insulative region 714, the DNW region 710 may be coupled to a voltage rail VDD through a non-insulative region 716, and the p-sub region 712 may be coupled to a digital GND (DGND) (e.g., reference potential for digital circuitry) through a non-insulative region 718. Thus, the DNW region 710 isolates the analog GND from the DGND, preventing noise coupling between analog and digital circuitry components. As illustrated, an STI region 720 may be disposed adjacent to non-insulative region 716, and an STI region 722 may be disposed between the non-insulative region 714 and the non-insulative region 718. In this case, the C2 terminal is disposed close to the non-insulative regions 218 and 220 (gate regions), reducing series resistance of the example TC device 200 of FIG. 7.

Figure 8:
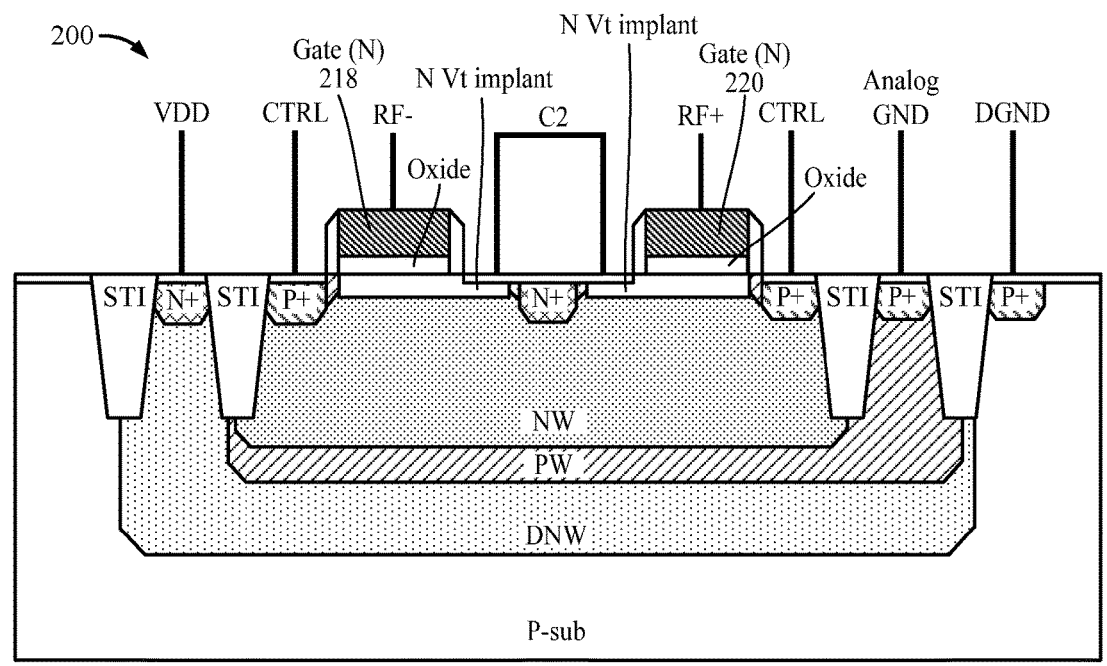
FIG. 8 illustrates the variable capacitor of FIG. 7 implemented with n-doped gate regions, in accordance with certain aspects of the present disclosure.

FIG. 8 illustrates the TC device 200 of FIG. 7 implemented with n-doped or n-type metal non-insulative regions 218 and 220 (gate regions), in accordance with certain aspects of the present disclosure. Using n-type gate region reduces the gate and silicon depletion (e.g., for n-type high-k/metal gate (HK/MG)).

Figure 9:
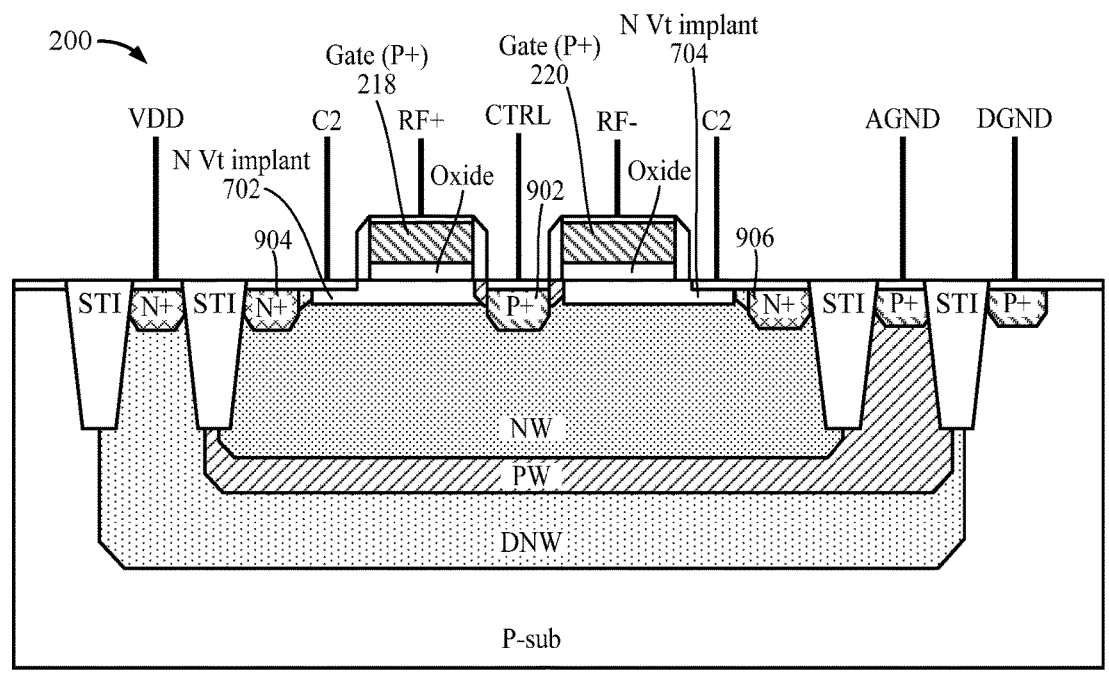
FIG. 9 illustrates the variable capacitor of FIG. 7 implemented with a control region disposed between threshold voltage implant regions, in accordance with certain aspects of the present disclosure.

FIG. 9 illustrates the TC device 200 of FIG. 7 implemented with a control region 902 disposed between Vt implant regions 702 and 704, in accordance with certain aspects of the present disclosure. In this case, the control region 902 is p-doped (e.g., P+). The non-insulative regions 904 and 906 are coupled to C2 terminals, and may be n-doped (e.g., N+), as illustrated.

Figure 10:
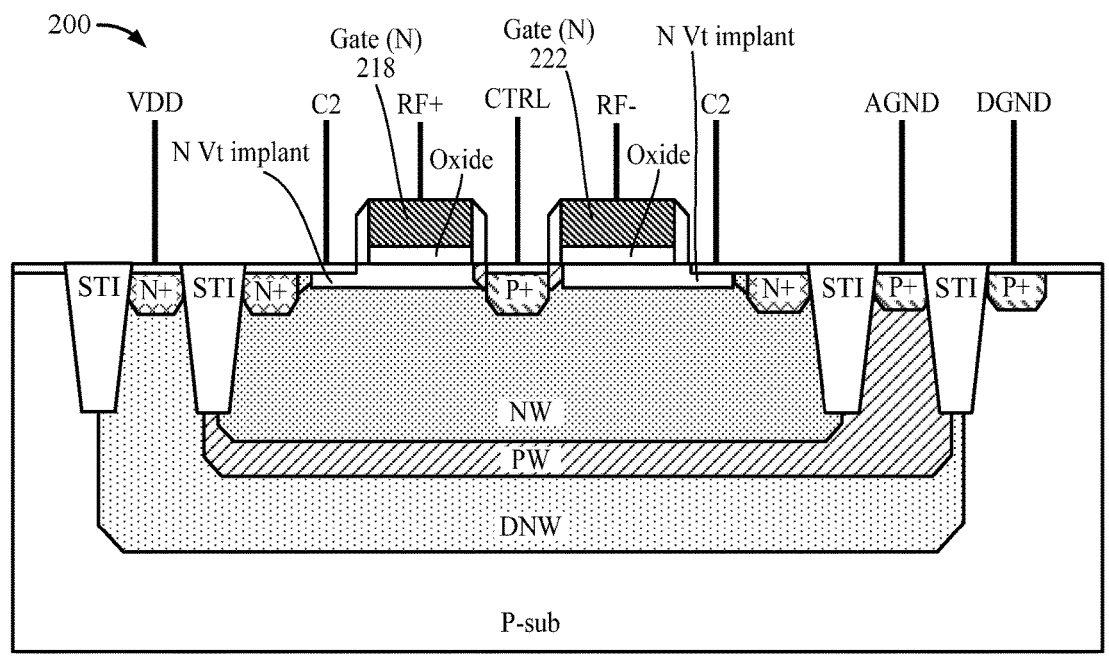
FIG. 10 illustrates the variable capacitor of FIG. 9 implemented with n-doped gate regions, in accordance with certain aspects of the present disclosure.

FIG. 10 illustrates the TC device 200 of FIG. 9 implemented with n-doped or n-type metal non-insulative regions 218 and 220 (gate regions), in accordance with certain aspects of the present disclosure.

Figure 11:
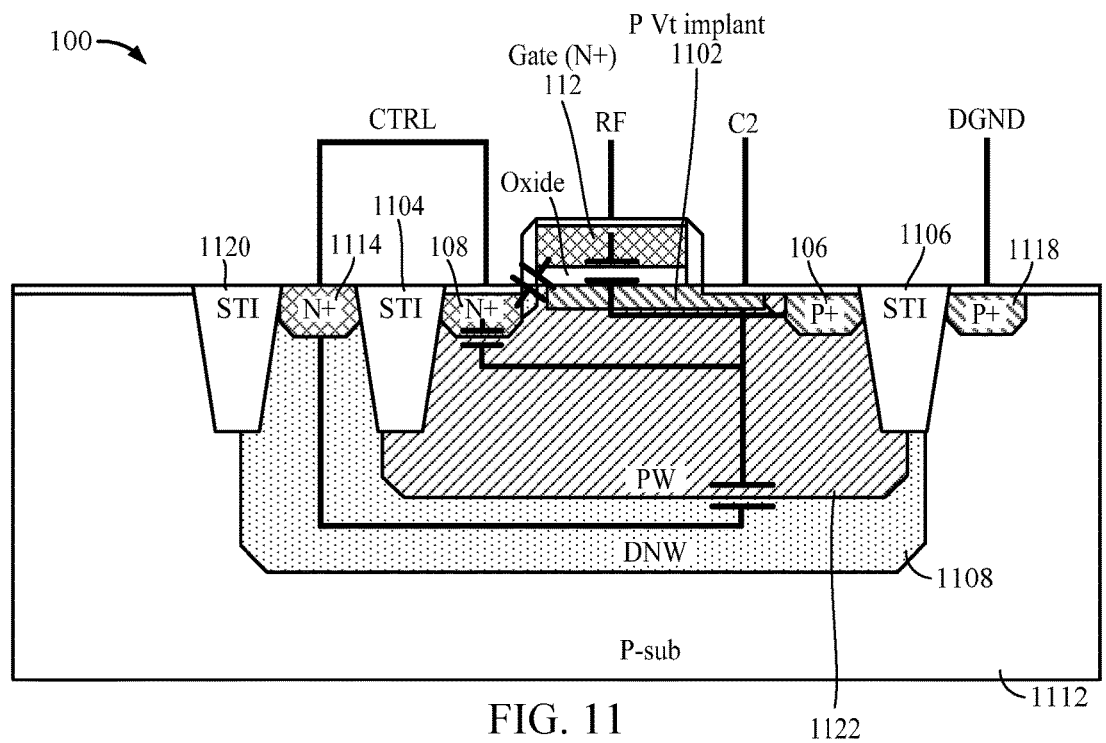
FIG. 11 illustrates the variable capacitor of FIG. 1 implemented with a p-doped threshold voltage implant region, in accordance with certain aspects of the present disclosure.

FIG. 11 illustrates the TC device 100 of FIG. 1 implemented with a p-doped Vt implant region 1102, in accordance with certain aspects of the present disclosure. The Vt implant region 1102 may be disposed in a channel between the control region 108 and the non-insulative region 106. In this case, the control region 108 may be n-doped (e.g., N+), the non-insulative region 112 (gate region) may be n-doped (e.g., N+) or n-type metal, and the non-insulative region 106 coupled to the C2 terminal may be p-doped (e.g., P+). In certain aspects, the control region 108 and the non-insulative region 106 may be disposed above a PW region 1122. The control region 108 may be disposed adjacent to a shallow trench isolation (STI) region 1104, and the non-insulative region 106 may be disposed adjacent to an STI region 1106. The PW region 1122 may be disposed above a DNW region 1108 and a p-doped substrate (p-sub) region 1112, as illustrated. The DNW region 1108 may be coupled to another control region 1114 which may be shorted to the control region 108, as illustrated. In certain aspects, the p-sub region 1112 may be coupled to a digital GND (DGND) (e.g., reference potential for digital circuitry) through a non-insulative region 1118. Thus, the DNW region 1108 isolates the DGND, preventing noise coupling from the TC device 100 of FIG. 11 from coupling to the digital circuitry components. As illustrated, an STI region 1120 may be disposed adjacent to the control region 1114.

Figure 12:
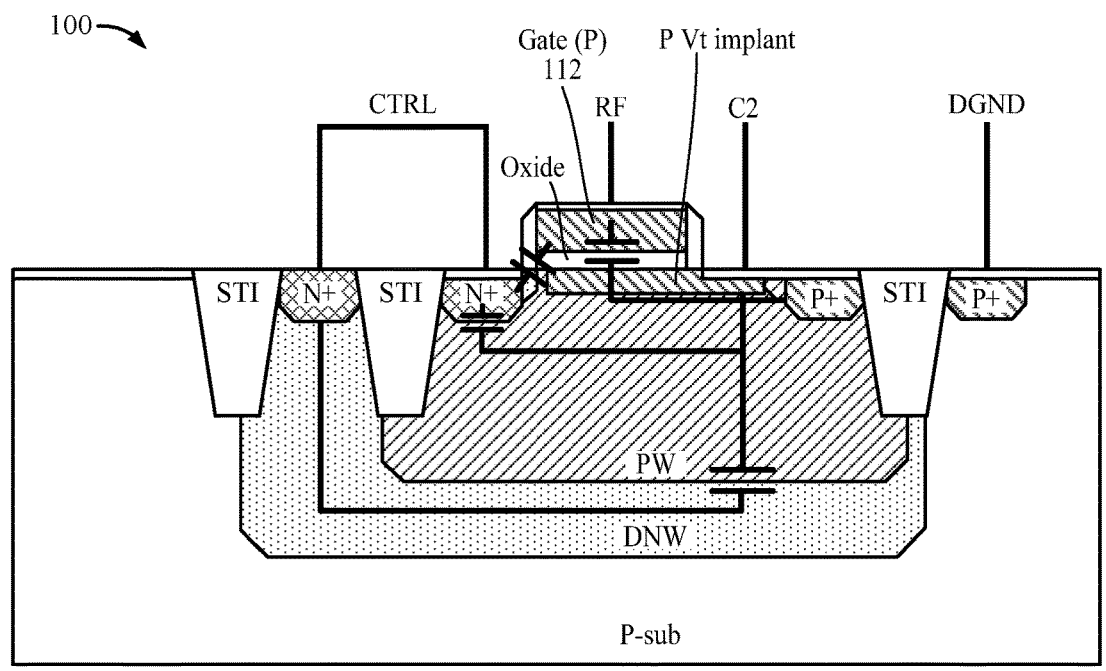
FIG. 12 illustrates the variable capacitor of FIG. 11 with a p-doped gate region, in accordance with certain aspects of the present disclosure.

FIG. 12 illustrates the TC device 100 of FIG. 11 with a p-doped or p-type metal non-insulative region 112 (gate region), in accordance with certain aspects of the present disclosure. Using a p-type gate region reduces the gate and silicon depletion (e.g., for n-type high-k/metal gate (HK/MG)).

Figure 13:
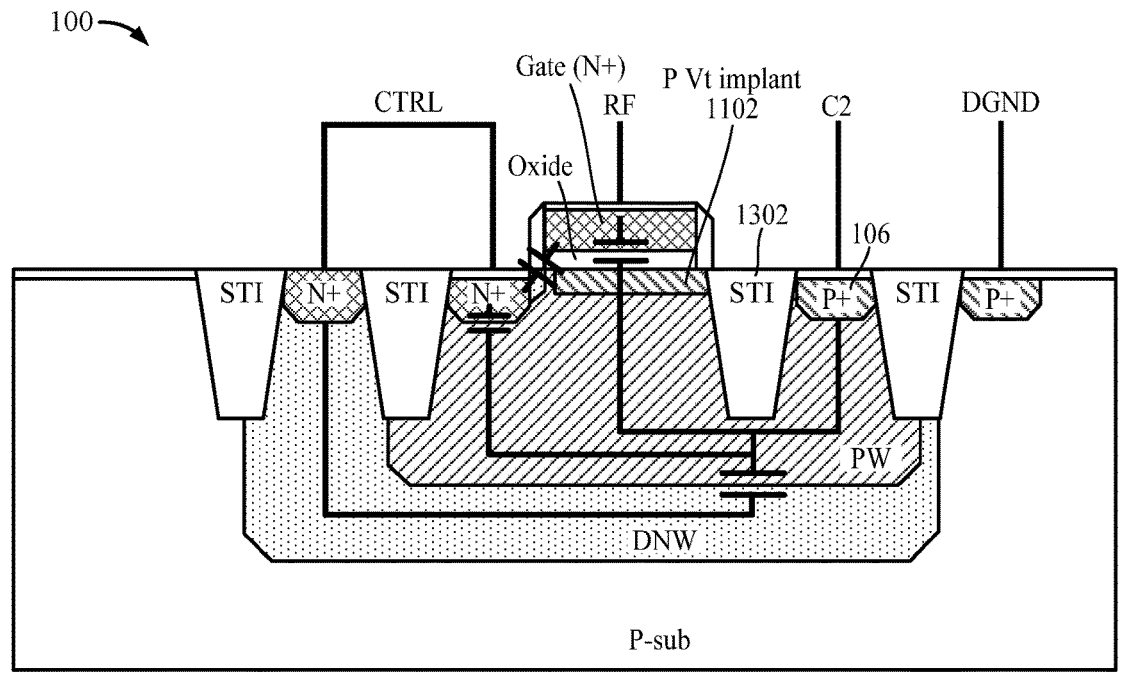
FIG. 13 illustrates the variable capacitor of FIG. 11 implemented with an extra STI region, in accordance with certain aspects of the present disclosure.

FIG. 13 illustrates the TC device 100 of FIG. 11 implemented with an extra STI region 1302, in accordance with certain aspects of the present disclosure. The STI region 1302 may be disposed between the Vt implant region 1102 and the non-insulative region 106. Adding the STI region 1302 increases the voltage rating of the TC device 100 of FIG. 13, as compared to the TC device 100 of FIG. 11.

Figure 14:
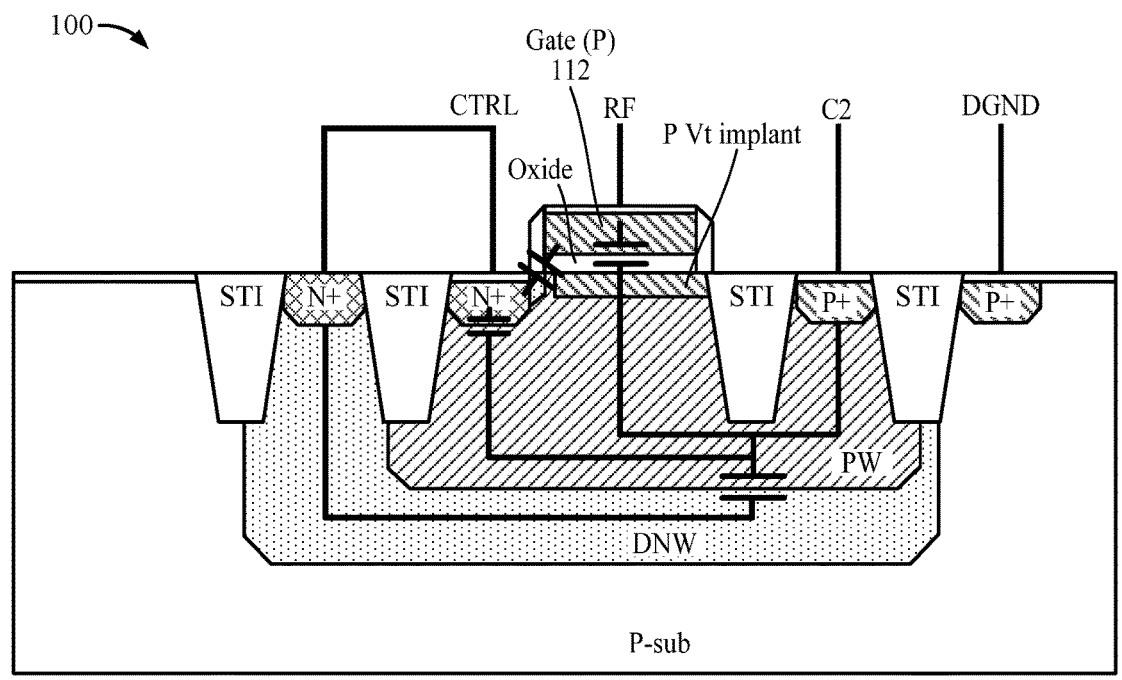
FIG. 14 illustrates the variable capacitor of FIG. 13 with a p-doped gate region, in accordance with certain aspects of the present disclosure.

FIG. 14 illustrates the TC device 100 of FIG. 13 with a p-doped or p-type metal non-insulative region 112 (gate region), in accordance with certain aspects of the present disclosure. Using a p-type gate region reduces the gate and silicon depletion (e.g., for n-type high-k/metal gate (HK/MG)).

Figure 15:
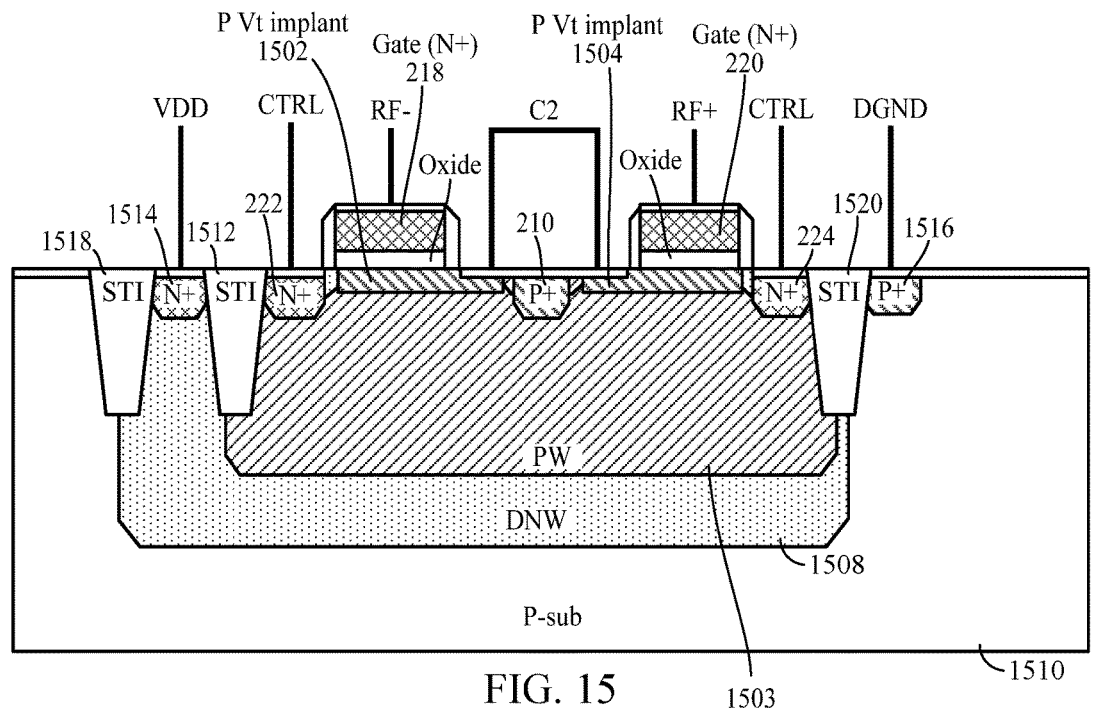
FIG. 15 illustrates the example differential variable capacitor of FIG. 2 implemented with p-doped threshold voltage implant regions, in accordance with certain aspects of the present disclosure.

FIG. 15 illustrates the example differential TC device 200 of FIG. 2 implemented with p-doped Vt implant regions 1502 and 1504, in accordance with certain aspects of the present disclosure. For example, the Vt implant region 1502 and the Vt implant region 1504 may be disposed above a PW region 1503, a DNW region 1508, and a p-sub region 1510. The DNW region 1508 may be coupled to a voltage rail VDD through a non-insulative region 1514, and the p-sub region 1510 may be coupled to DGND through a non-insulative region 1516. An STI region 1512 may be formed between the control region 222 and the non-insulative region 1514, an STI region 1518 may be coupled adjacent to the non-insulative region 1514, and an STI region 1520 may be formed between the control region 224 and non-insulative region 1516.

Figure 16:
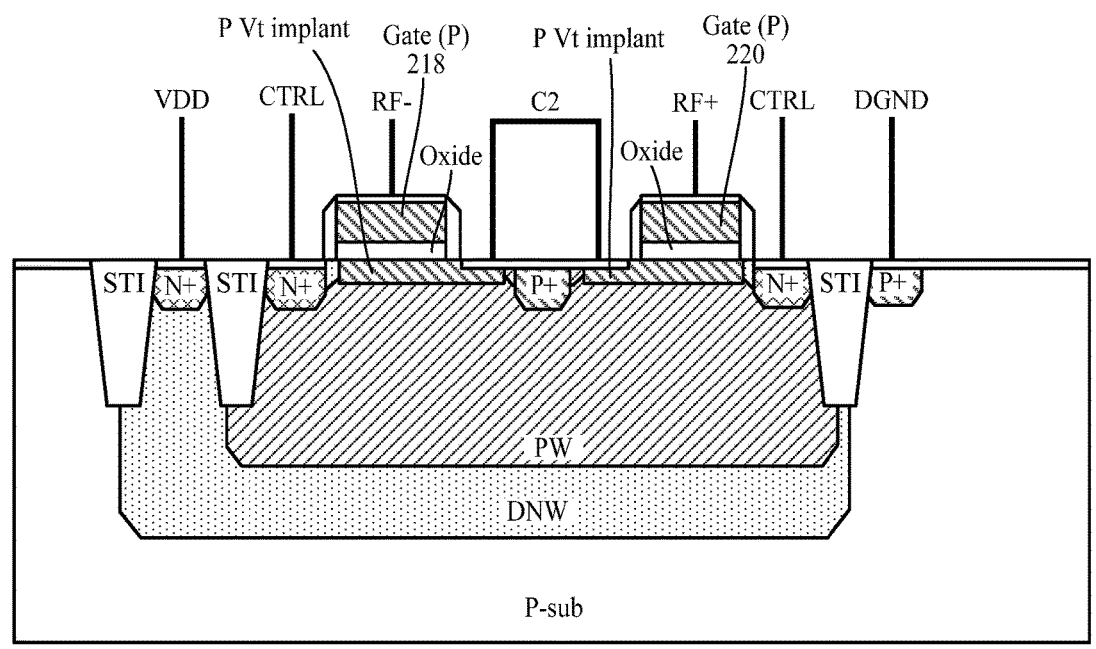
FIG. 16 illustrates the example variable capacitor of FIG. 15 implemented with a p-doped gate regions, in accordance with certain aspects of the present disclosure.

FIG. 16 illustrates the example TC device 200 of FIG. 15 implemented with p-doped or p-type metal non-insulative regions 218 and 220 (gate regions), in accordance with certain aspects of the present disclosure. Using p-type gate regions reduces the gate and silicon depletion (e.g., for n-type HK/MG)).

Figure 17:
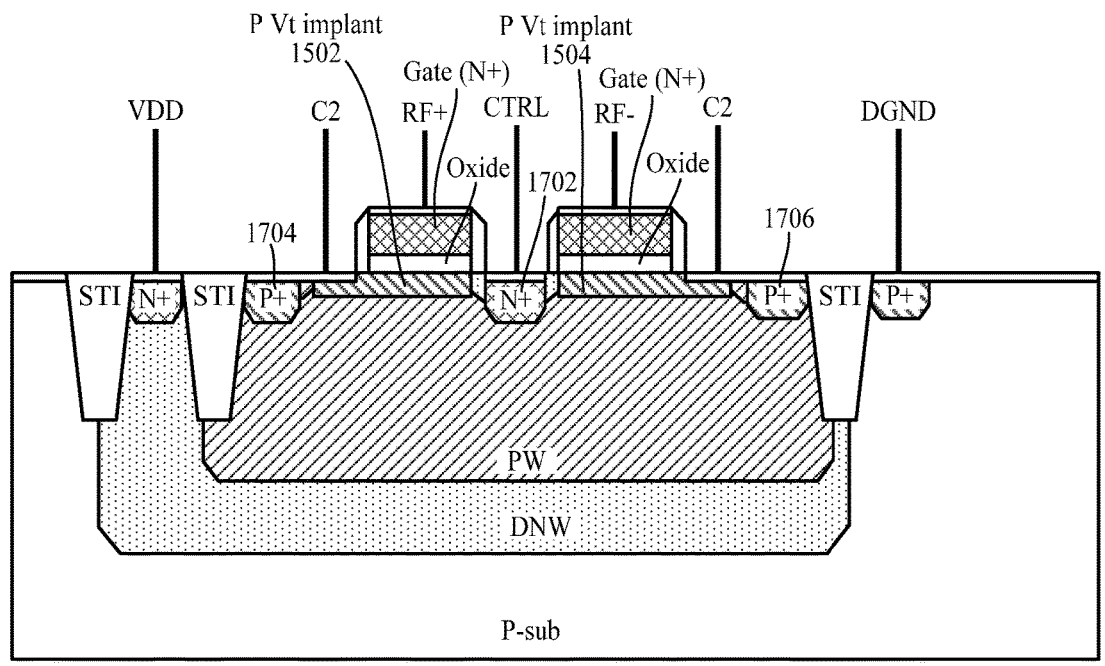
FIG. 17 illustrates the example variable capacitor of FIG. 15 implemented with a control region disposed between threshold voltage implant regions, in accordance with certain aspect of the present disclosure.

FIG. 17 illustrates the example TC device 200 of FIG. 15 implemented with a control region 1702 disposed adjacent to Vt implant regions 1502 and 1504, in accordance with certain aspect of the present disclosure. In this case, the control region 1702 may be n-doped (e.g., N+). The non-insulative regions 1704 and 1706 may be coupled to C2 terminals and may be p-doped (e.g., P+), as illustrated.

Figure 18:
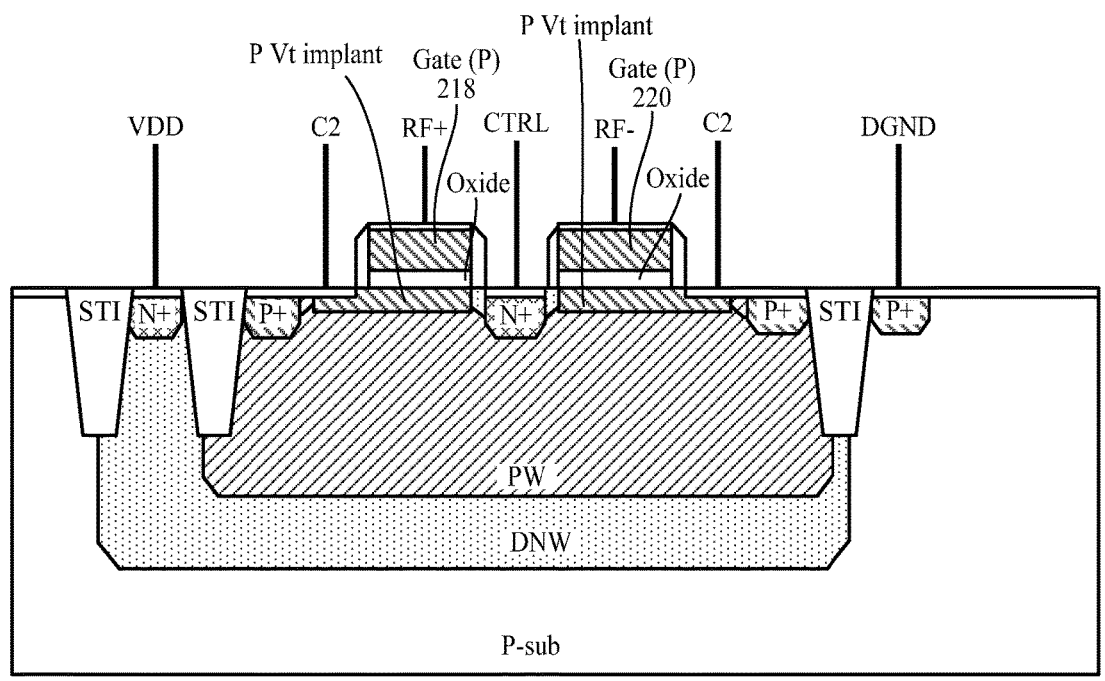
FIG. 18 illustrates the example variable capacitor of FIG. 17 implemented with p-doped gate regions, in accordance with certain aspects of the present disclosure.

FIG. 18 illustrates the example TC device 200 of FIG. 17 implemented with p-doped or p-type metal non-insulative regions 218 and 220, in accordance with certain aspects of the present disclosure.

Figure 19:
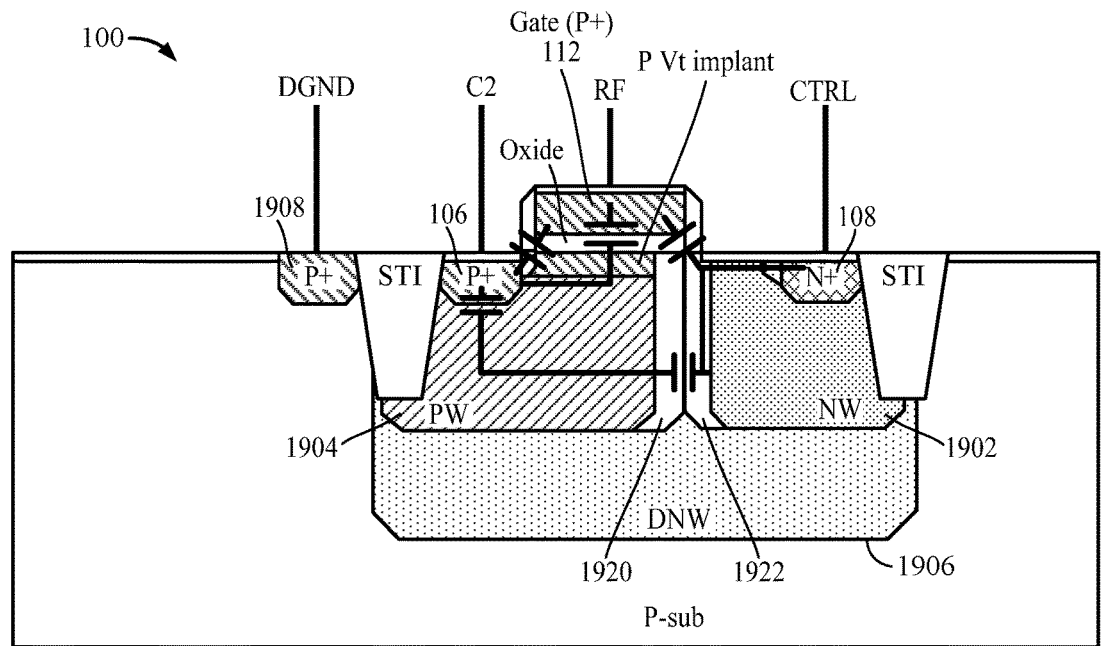
FIG. 19 illustrates the example variable capacitor of FIG. 1 implemented with a control region and a non-insulative region disposed over separate n-well (NW) and p-well (PW) regions, respectively, in accordance with certain aspects of the present disclosure.

FIG. 19 illustrates the example TC device 100 of FIG. 1 implemented with a control region 108 and a non-insulative region 106 disposed over separate NW and PW regions 1902 and 1904, in accordance with certain aspects of the present disclosure. Using separate PW and NW regions 1902 and 1904 may allow for large depletion (e.g., as illustrated by depletion regions 1920 and 1922) from the PW and the NW regions, thereby increasing the tuning range of the TC device 100. Both the NW region 1902 (e.g., doped N−) and the PW region 1904 (e.g., doped P−) are formed above a DNW region 1906 and the p-sub region 312. The p-sub region may be coupled to DGND through a non-insulative region 1908. The DNW region 1906 prevents coupling noise to DGND. This configuration also reduces counter doping issues with the PW and the NW regions, which lead to degradation of the TC device 100.

Figure 20:
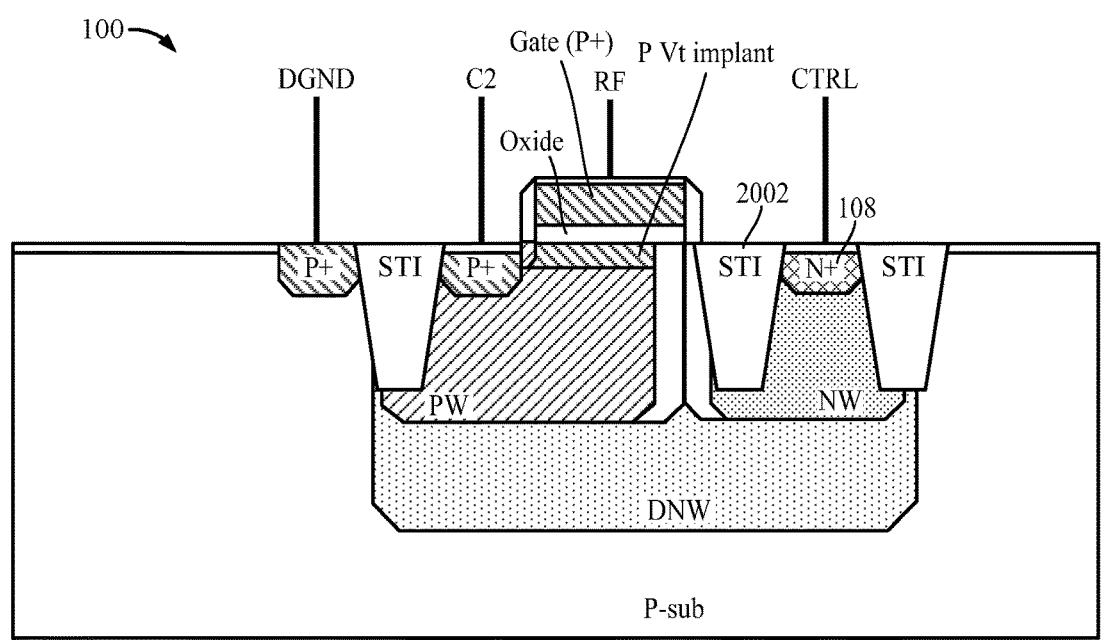
FIG. 20 illustrates the example variable capacitor of FIG. 19 implemented with an extra STI region, in accordance with certain aspects of the present disclosure.

FIG. 20 illustrates the example TC device 100 of FIG. 19 implemented with an extra STI region 2002, in accordance with certain aspects of the present disclosure. The STI region 2002 is disposed adjacent to the control region 108. Adding the STI region 2002 increases the voltage rating of the TC device 100 of FIG. 20, as compared to the TC device 100 of FIG. 19.

Figure 21:
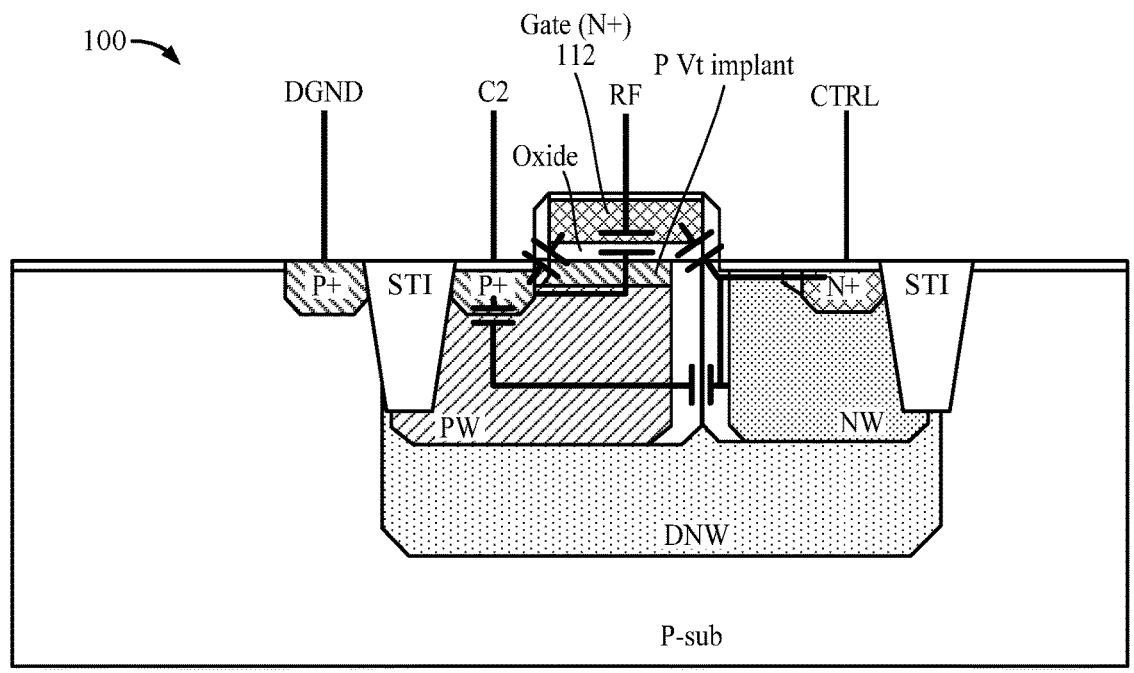
FIGS. 21 and 22 illustrate the example variable capacitors of FIGS. 19 and 20, respectively, implemented with an n-doped gate region, in accordance with certain aspects of the present disclosure.
Figure 22:
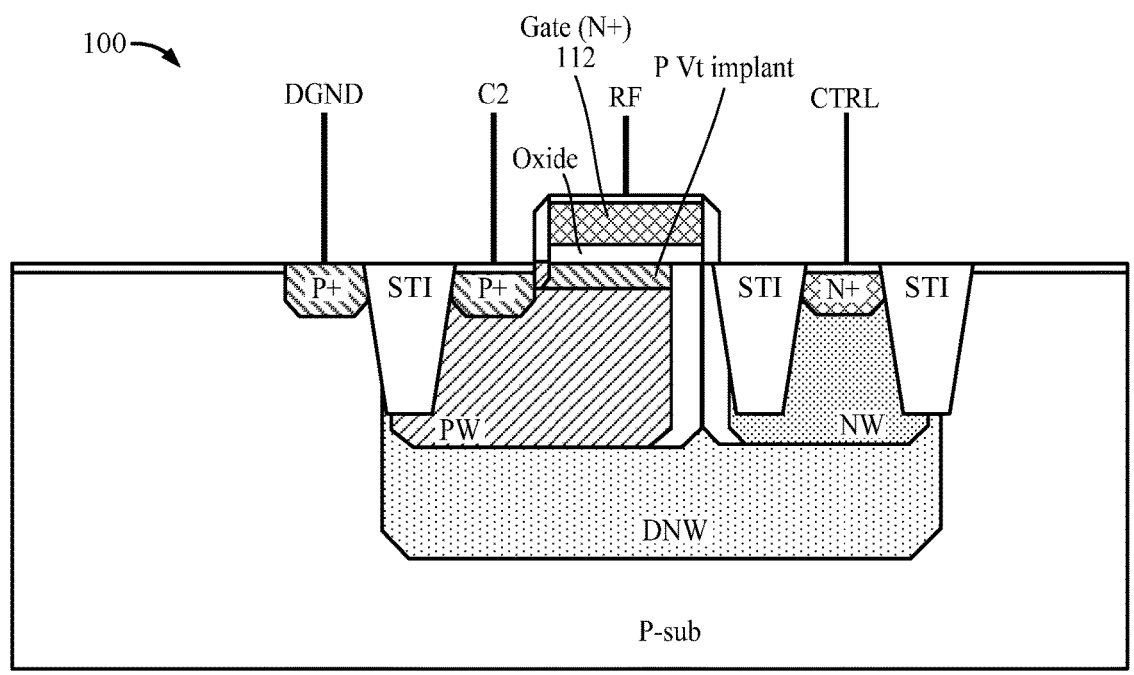

FIGS. 21 and 22 illustrate the example TC devices 100 of FIGS. 19 and 20, respectively, implemented with an n-doped or n-typed metal non-insulative region 112, in accordance with certain aspects of the present disclosure.

Figure 23:
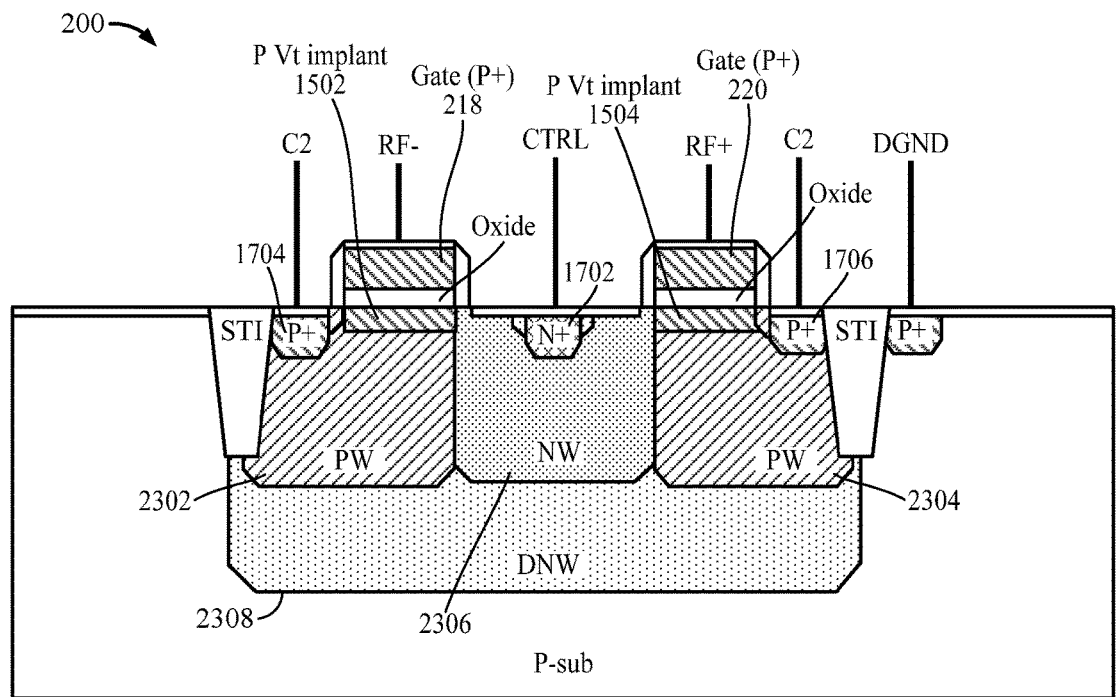
FIG. 23 illustrates an example differential variable capacitor implemented with non-insulative regions disposed over PW regions and a control region disposed over an NW region, in accordance with certain aspects of the present disclosure.

FIG. 23 illustrates the example differential TC device 200 of FIG. 18 implemented with the non-insulative regions 1704 and 1706 disposed over separate p-well regions 2302 and 2304 and the control region 1702 disposed over an n-well region 2306, in accordance with certain aspects of the present disclosure. The p-well regions 2302, 2304 and the n-well region 2306 are disposed above a DNW region 2308 and a p-sub region 1510.

Figure 24:
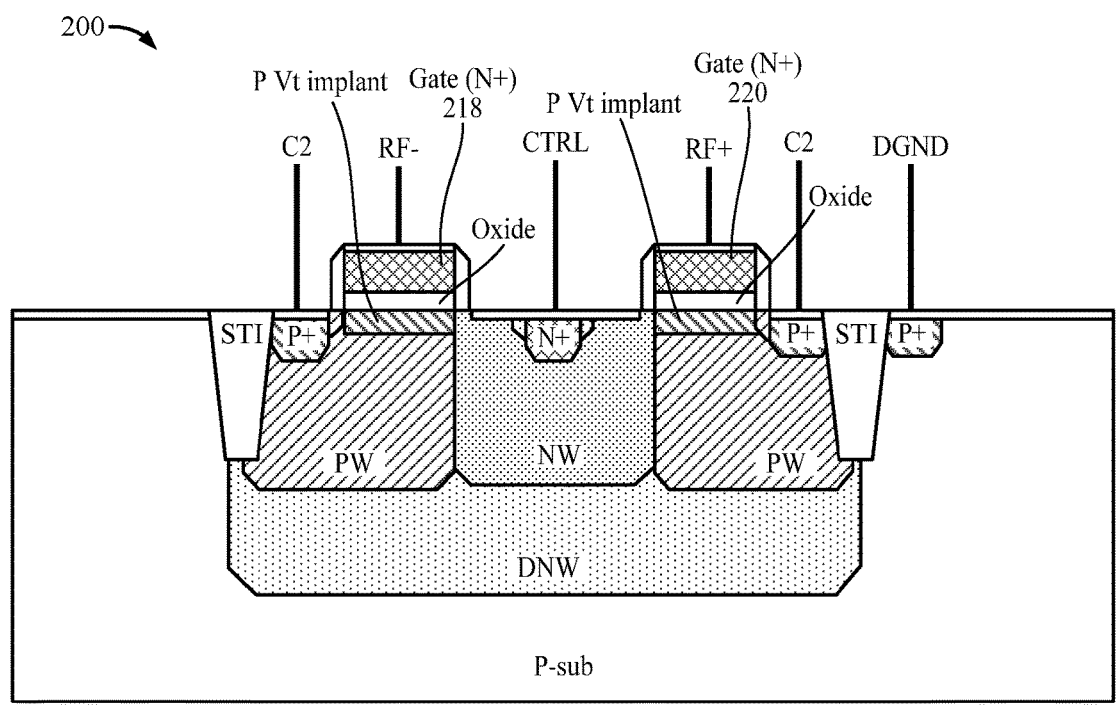
FIG. 24 illustrates the example differential variable capacitor of FIG. 23 implemented with n-doped gate regions, in accordance with certain aspects of the present disclosure.

FIG. 24 illustrates the example differential TC device 200 of FIG. 23 implemented with n-doped or n-typed metal non-insulative regions 218 and 220 (gate regions), in accordance with certain aspects of the present disclosure.

Figure 25:
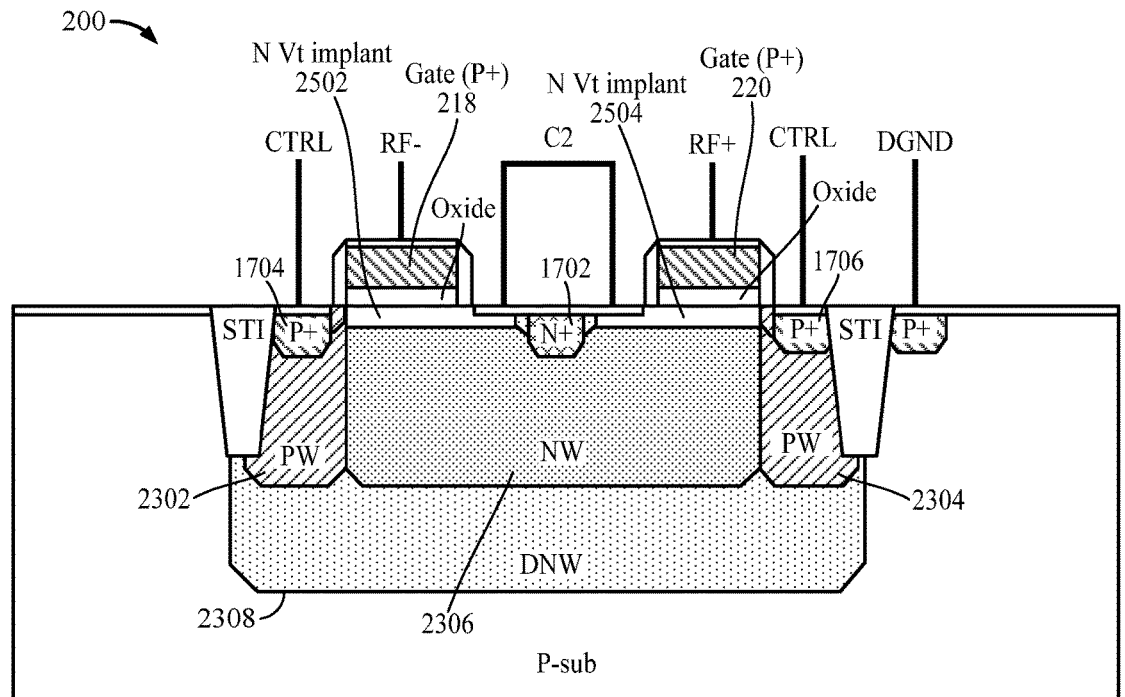
FIG. 25 illustrates the example differential variable capacitor of FIG. 23 implemented with n-doped threshold voltage implant regions, in accordance with certain aspects of the present disclosure.

FIG. 25 illustrates the example differential TC device 200 of FIG. 23 implemented with n-doped Vt implant regions 2502 and 2504, in accordance with certain aspects of the present disclosure. In this case, the Vt implant regions 2502 and 2504 are disposed above the NW region 2306, as illustrated. The control region 1702 is coupled to the C2 terminal, and the non-insulative regions 1704 and 1706 are coupled to control terminals.

Figure 26:
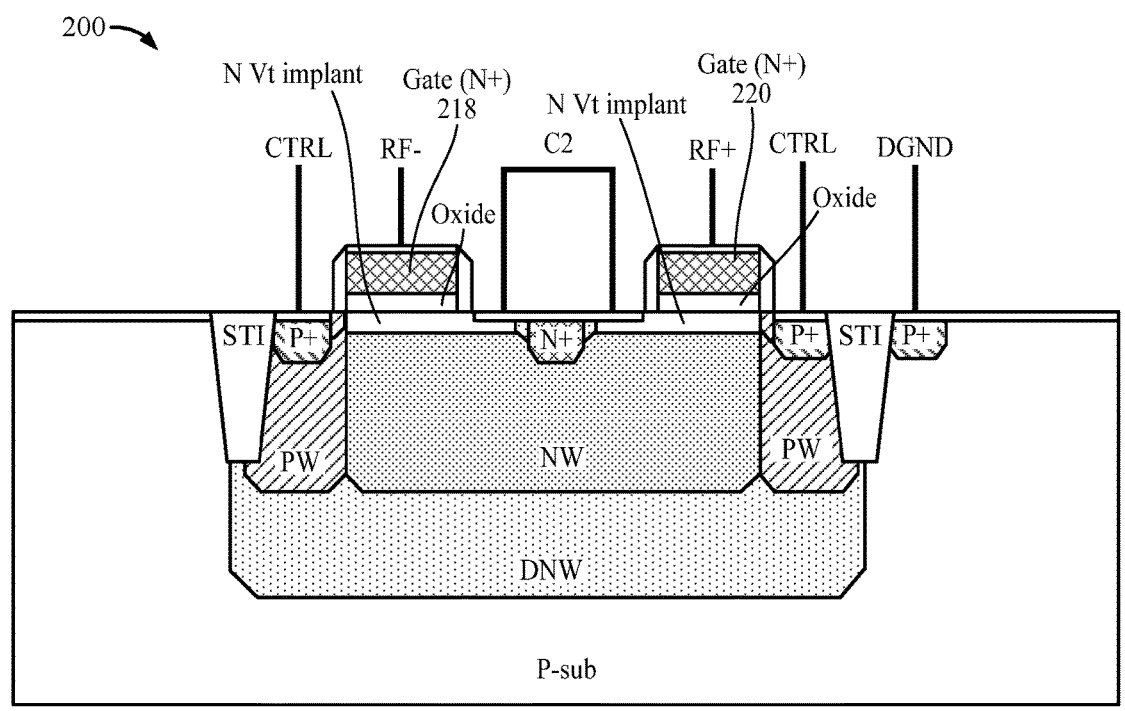
FIG. 26 illustrates the example differential variable capacitor of FIG. 25 implemented with n-doped gate regions, in accordance with certain aspects of the present disclosure.

FIG. 26 illustrates the example differential TC device 200 of FIG. 25 implemented with n-doped or n-typed metal non-insulative regions 218 and 220 (gate regions), in accordance with certain aspects of the present disclosure.

Figure 27:
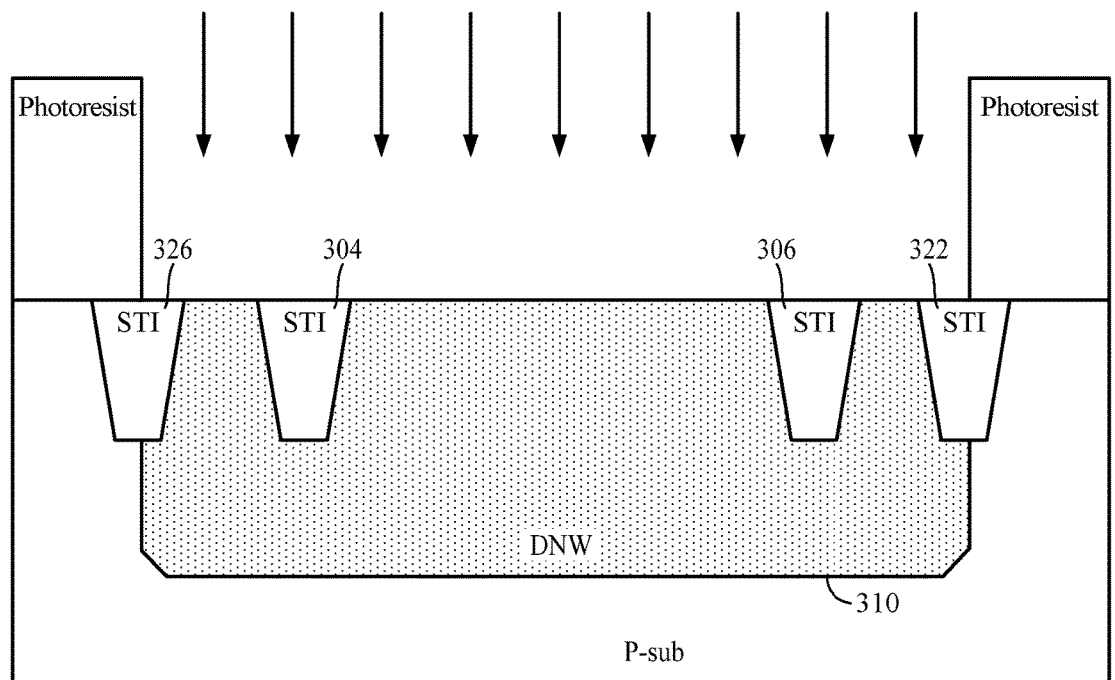
FIGS. 27-40 illustrate a process flow for fabricating a variable capacitor having an n-doped threshold voltage implant region, in accordance with certain aspects of the present disclosure.
Figure 28:
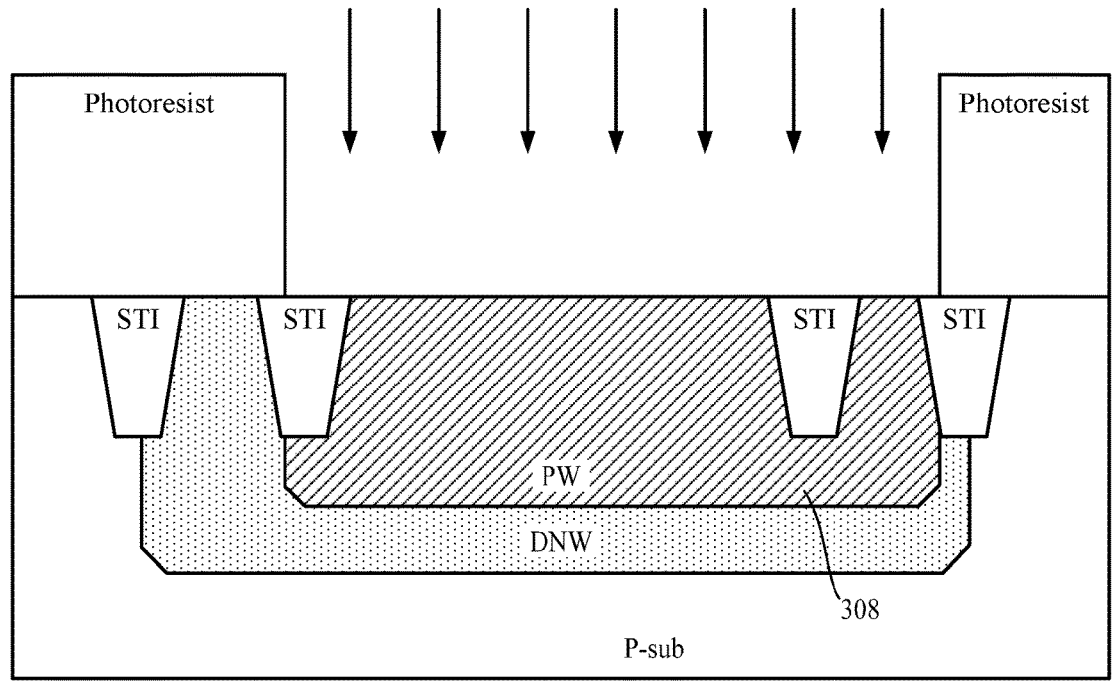
Figure 29:
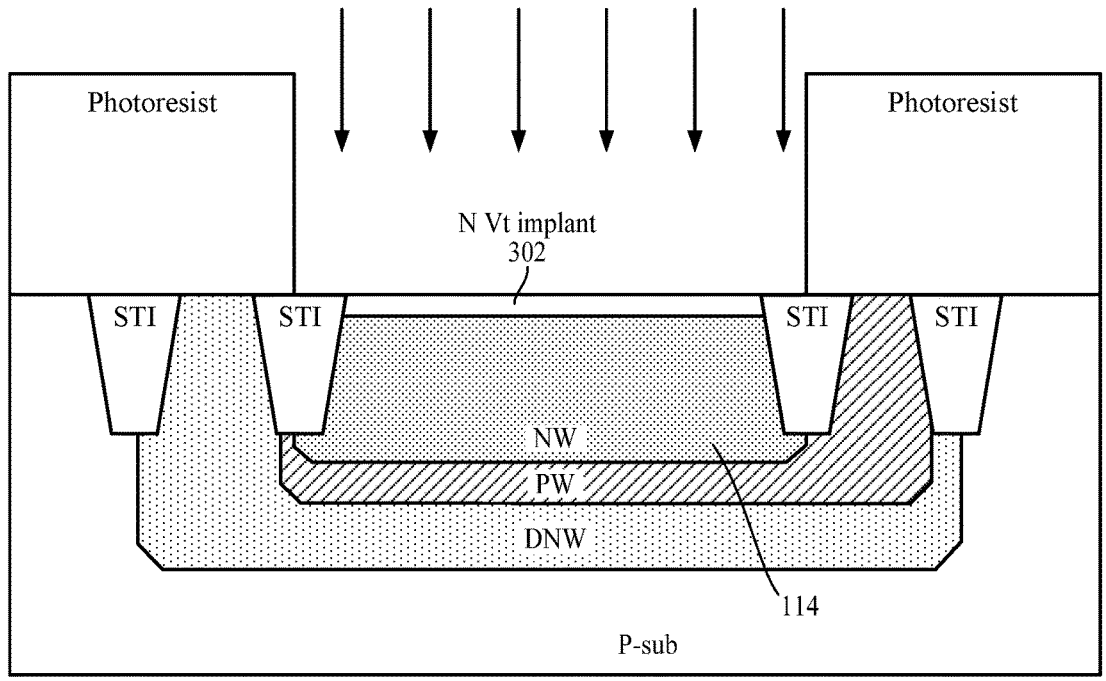
Figure 30:
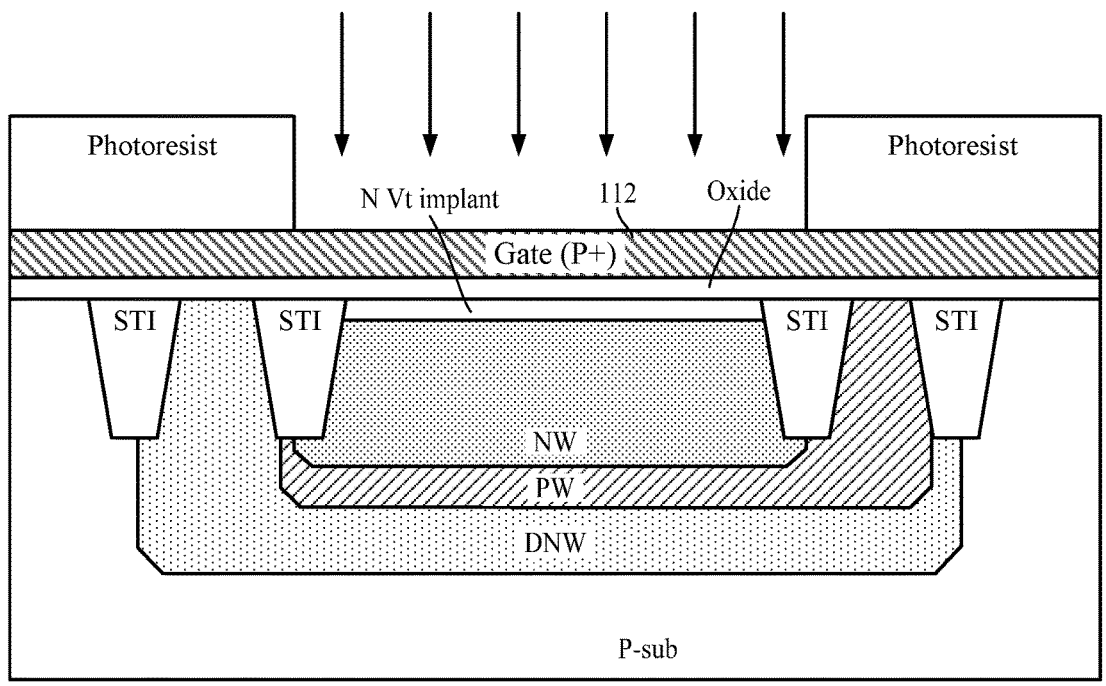
Figure 31:
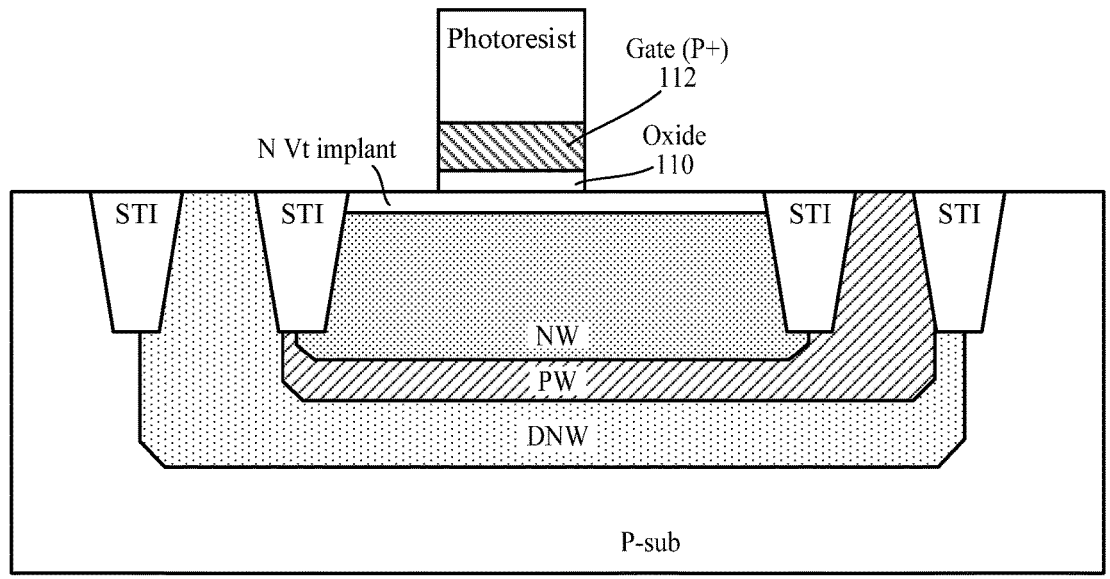
Figure 32:
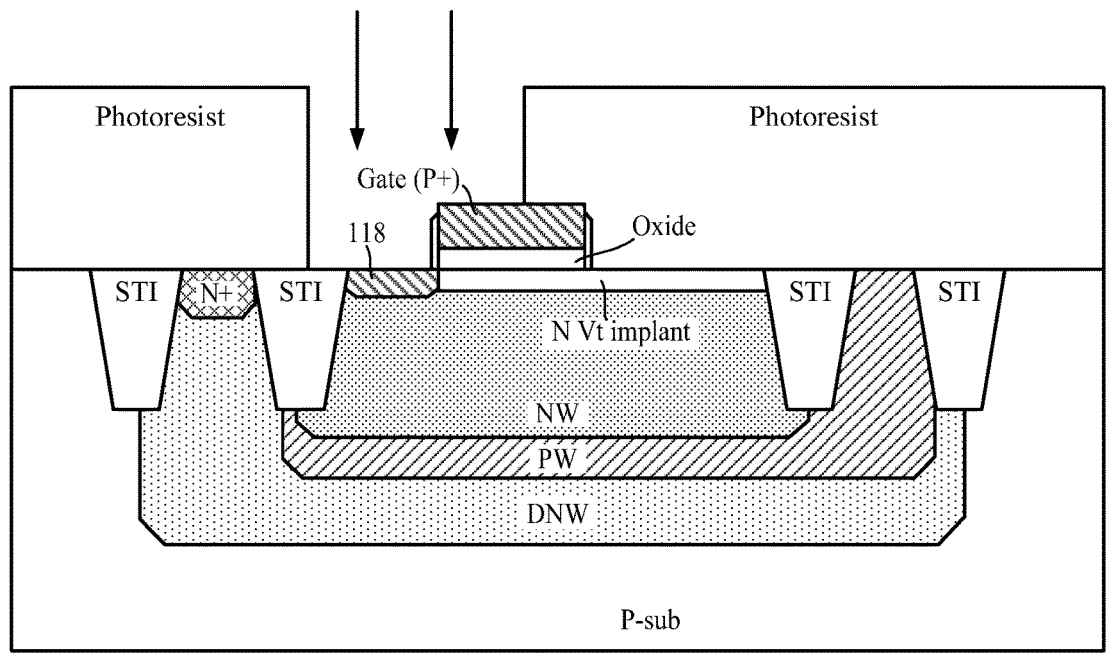
Figure 33:
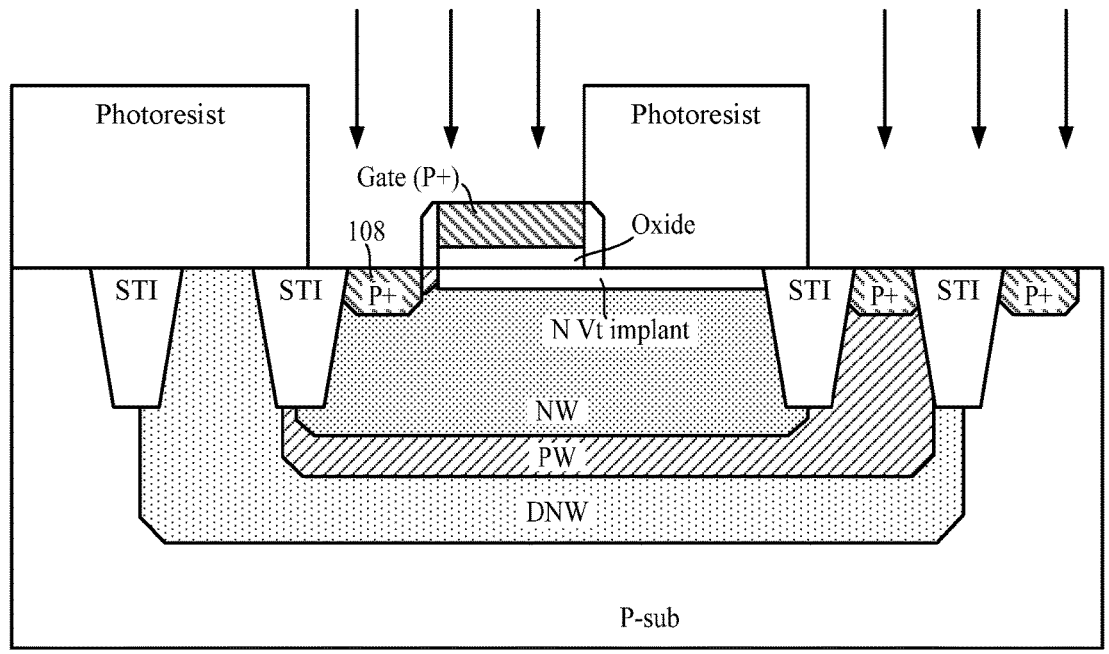

FIGS. 27-40 illustrate a process flow for fabricating the TC device of FIGS. 3 and 5, in accordance with certain aspects of the present disclosure. As illustrated in FIG. 27, after the STI regions 304, 306, 320, and 322 are formed in the p-sub region 312, a photoresist pattern may be applied as shown, and the DNW retrograde implant region 310 may be formed in areas of the p-sub region. Then, a new photoresist pattern may be configured according to FIG. 28, and the PW region 308 may be formed. The photoresist pattern may then be configured (or another new photoresist pattern may be applied) to form the NW region 114 and the Vt implant region 302, as illustrated in FIG. 29. This may then be followed by a thermal annealing process, as well as gate oxide growth, poly deposition, and poly dopant mask for poly P+ implantation, as illustrated in FIG. 30. Poly dopant mask may then be stripped and cleaned, and poly hard mask may be deposited, followed by poly photo and etch patterning, as illustrated in FIG. 31. At this point, the gate photoresist may be stripped and cleaned, followed by forming of an offset spacer, a p-type lightly doped drain (PLDD) and pocket photoresist patterning and implant, to form the p-doped region 118, as illustrated in FIG. 32. Next, the PLDD photoresist may be stripped and cleaned, silicon nitride (SiN) may be deposited, and etch back may be performed to form main spacer, followed by P+ source/drain (S/D) photoresist patterning and P+ S/D implant to form the non-insulative region 108, as illustrated in FIG. 33.

Figure 34:
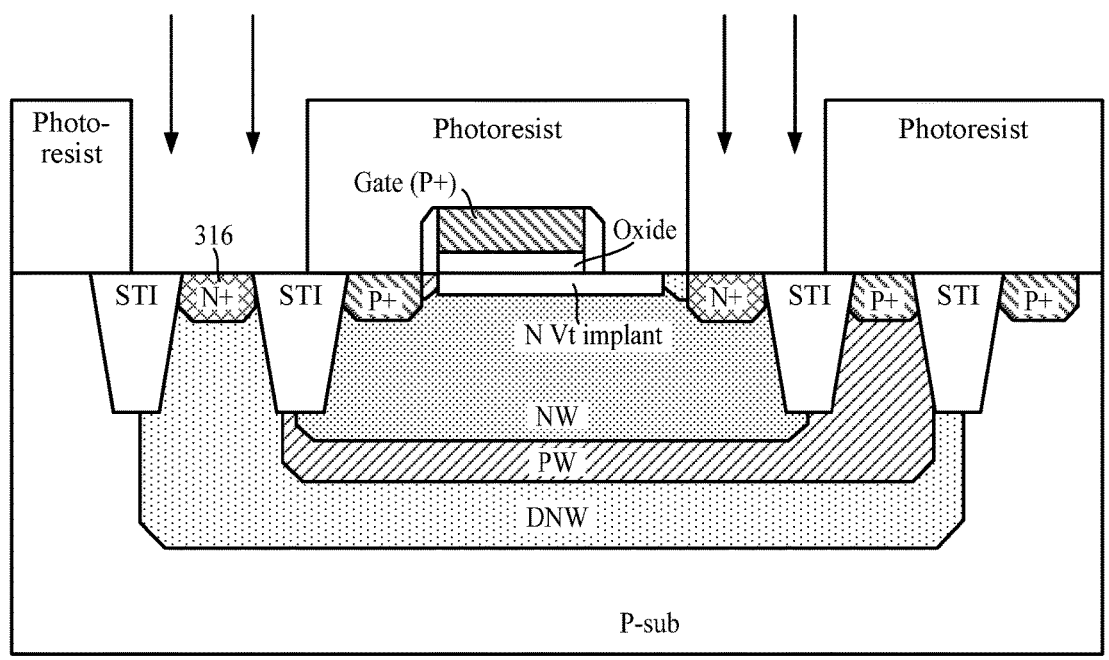
Figure 35:
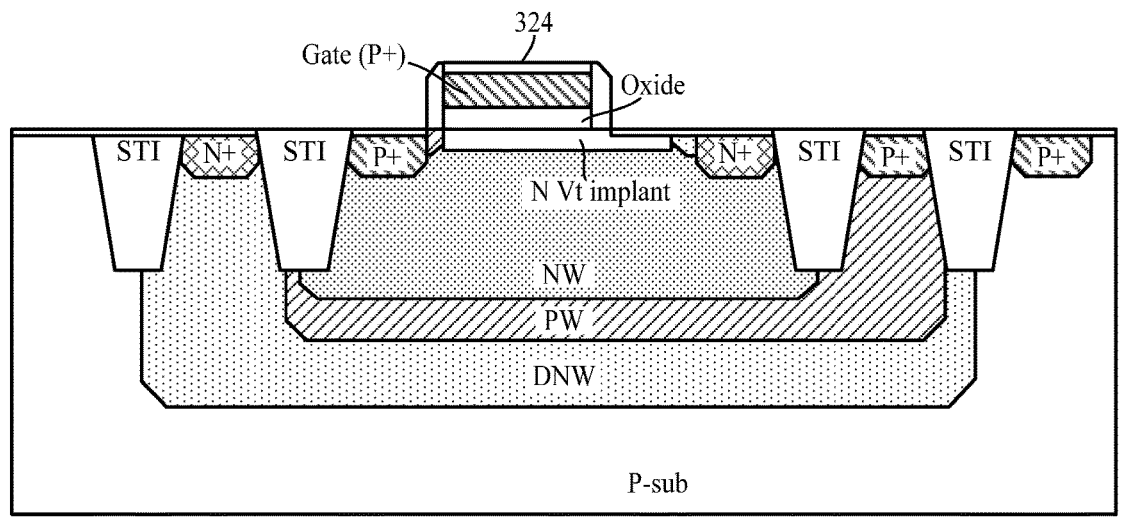
Figure 36:
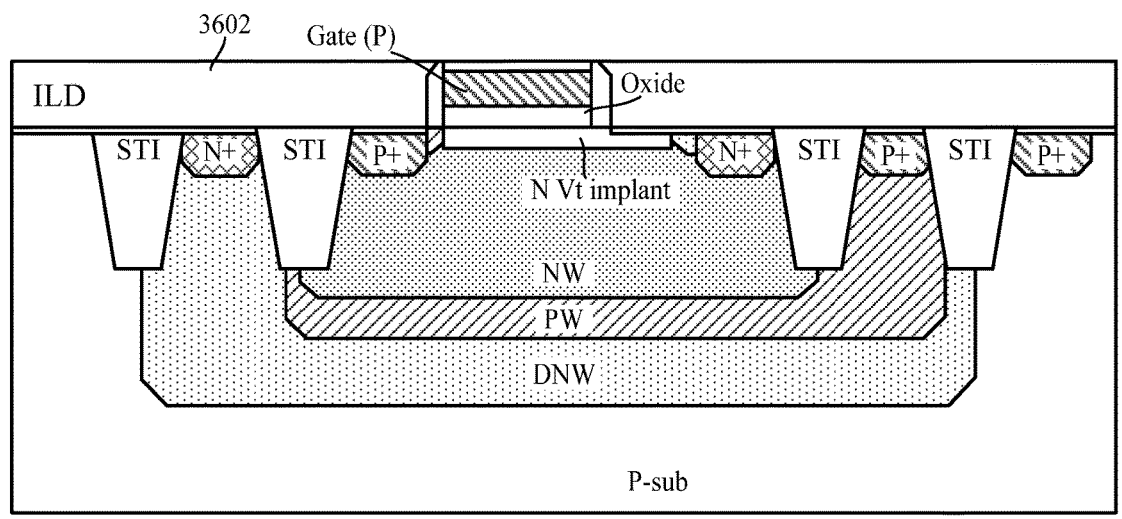
Figure 37:
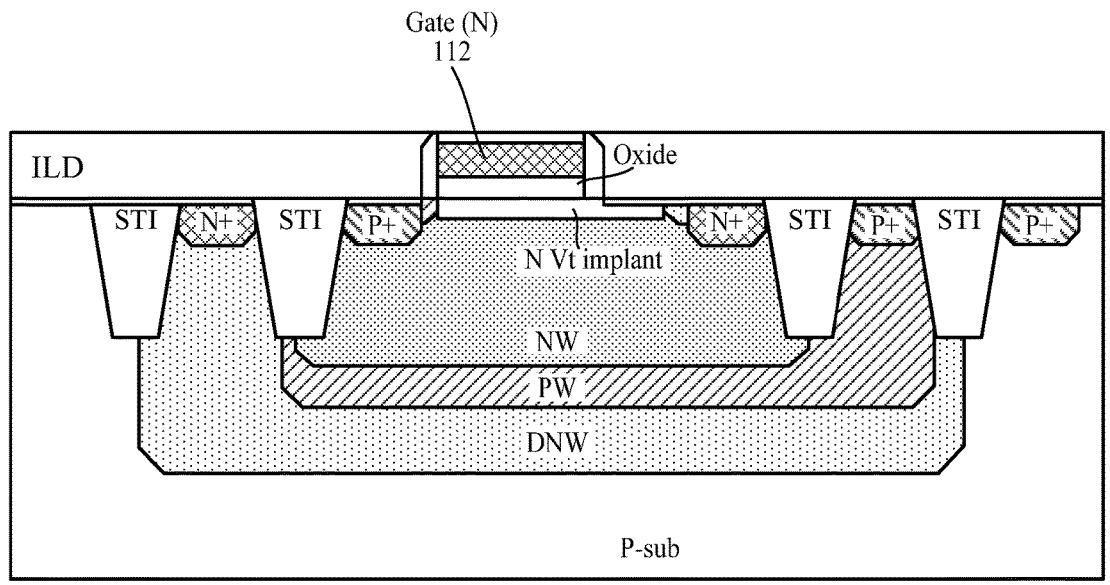

At this point, the P+ S/D photoresist may be stripped and cleaned, and the N+ S/D photoresist patterning may be deposited to form the N+ S/D implant (e.g., non-insulative region 316), as illustrated in FIG. 34. Then, the N+ S/D photoresist may be stripped and cleaned, thermal annealing may be performed to active dopant regions, and a silicide layer 324 may be formed on the active and gate layers, as illustrated in FIG. 35. As illustrated in FIG. 36, an interlayer dielectric (ILD) film 2602 may be deposited, chemical mechanical polishing (CMP) may be performed to stop on dummy poly, the P+ dummy poly material may be removed, and p-type metal gate or p-type high-k/metal gate (HK/MG) may be deposited. In some cases, instead of p-type, n-type metal gate or n-type HK/MG may be deposited, as illustrated in FIG. 37. Moreover, CMP may be performed for the metal gate.

Figure 38:
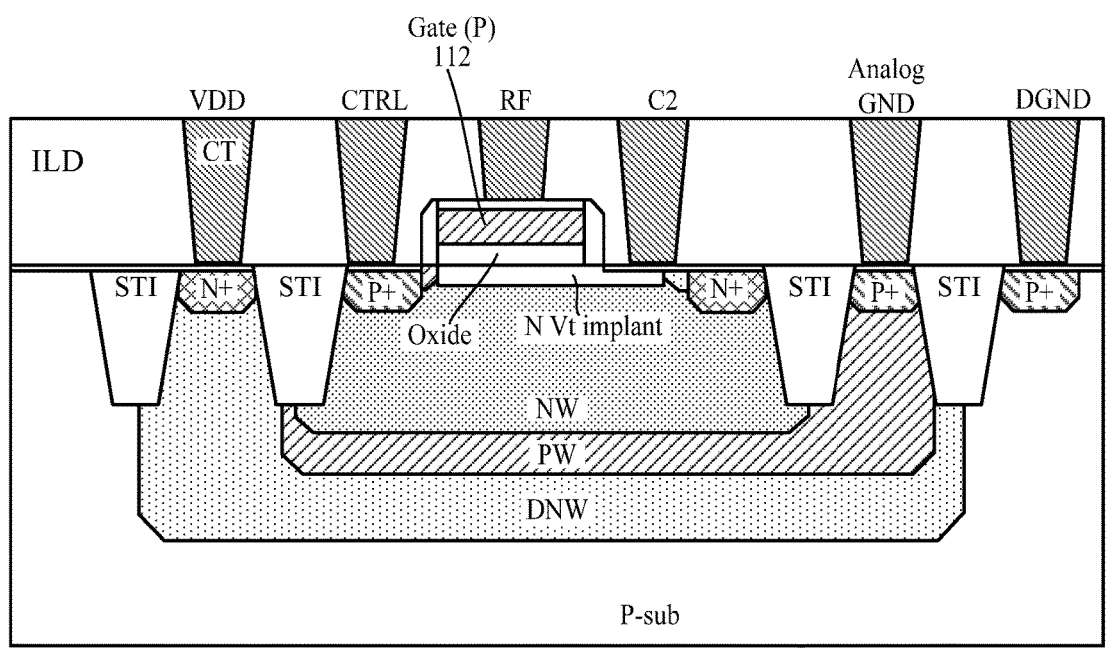
Figure 39:
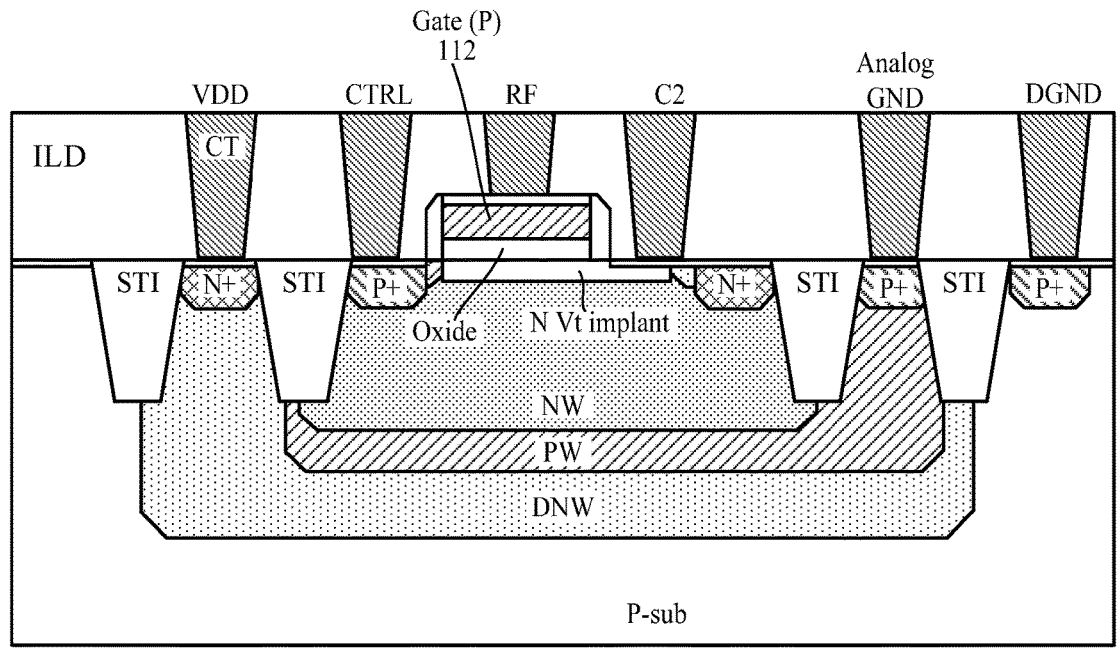
Figure 40:
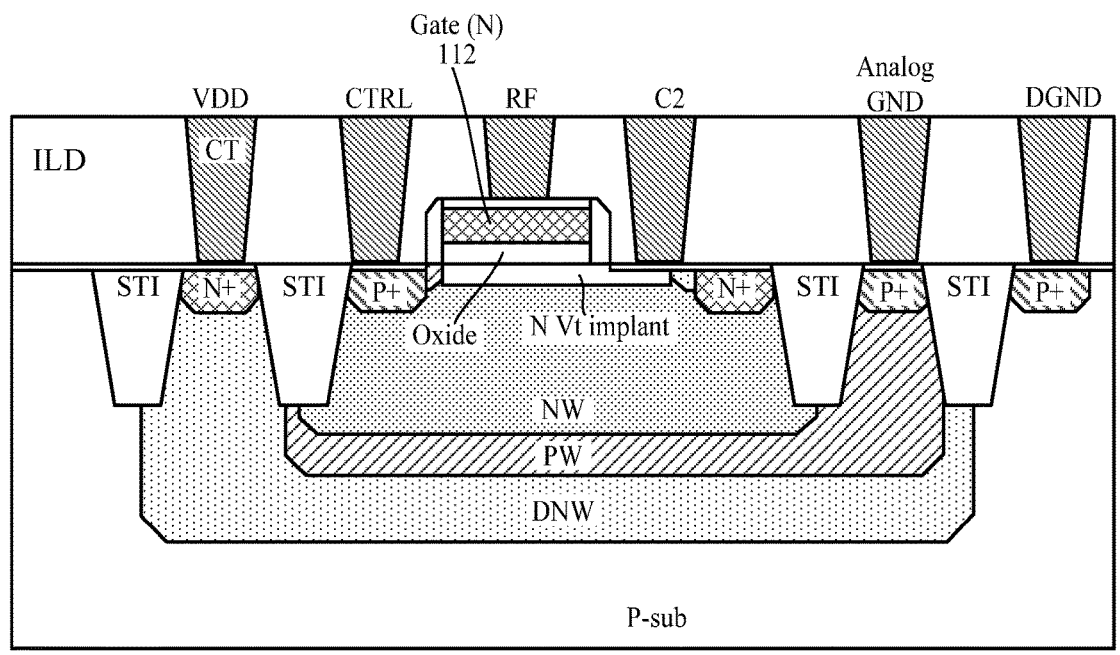

The ILD film may then be deposited, and CMP may be performed for the ILD. The contact (CT) pattern opening may be created and filled with metal material, and CMP may be performed for the CTs (i.e., the terminals). The C2 CT may be fabricated to be close to the gate to reduce parasitic resistance since silicide form will connect N+ with NW. This may be followed by back end of line (BEOL) processing to form metallization lines for the transcap, as illustrated in FIG. 38. In some cases, the gate region (non-insulative region 112) may be implemented using high-k/metal gate (HK/MG), as illustrated in FIG. 39. As presented above with respect to FIG. 37, instead of p-type, n-type metal gate or n-type HK/MG may be deposited to form an n-type gate region (non-insulative region 112), as illustrated in FIG. 40.

Figure 41:
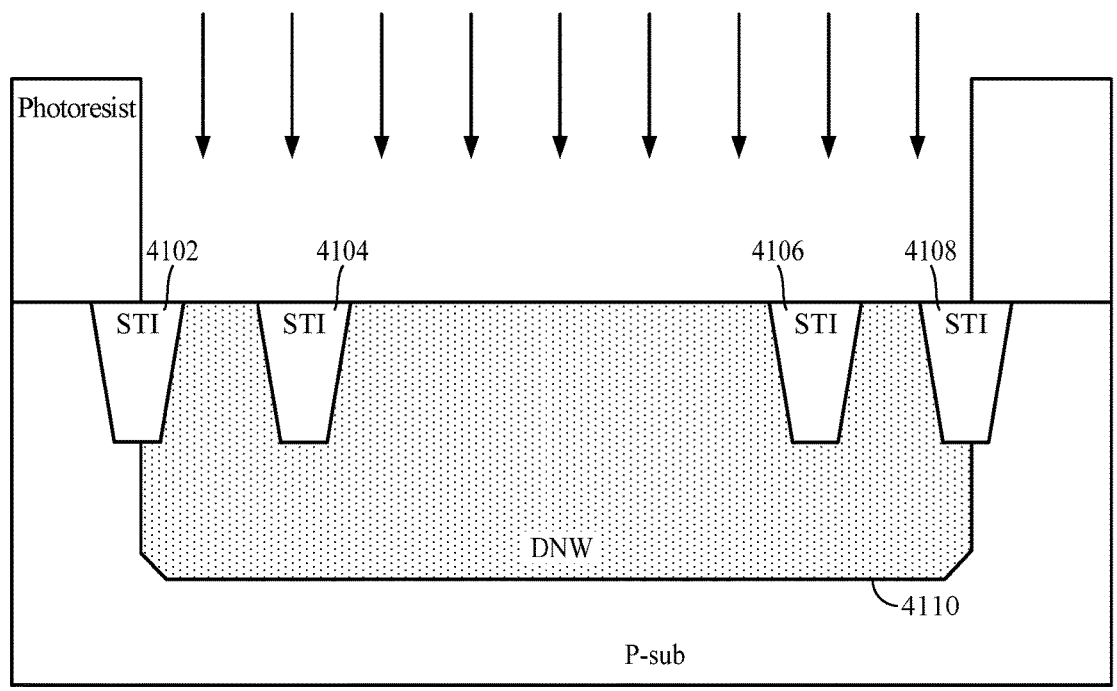
FIGS. 41-53 illustrate a process flow for fabricating a variable capacitor having a p-doped threshold voltage implant region, in accordance with certain aspects of the present disclosure.
Figure 42:
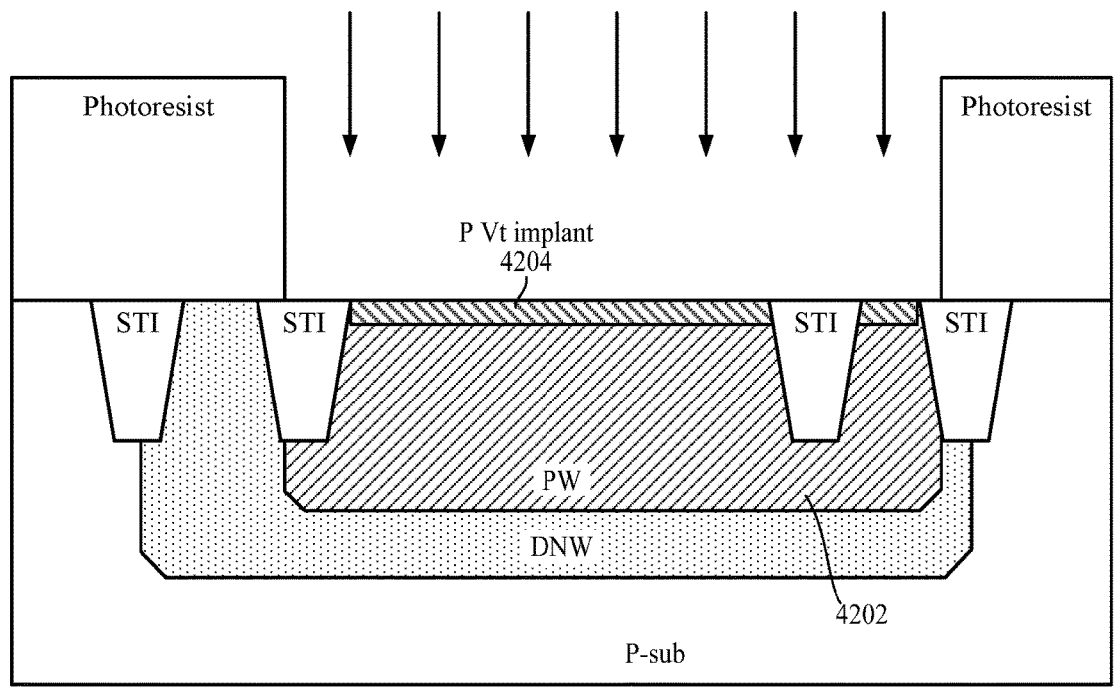
Figure 43:
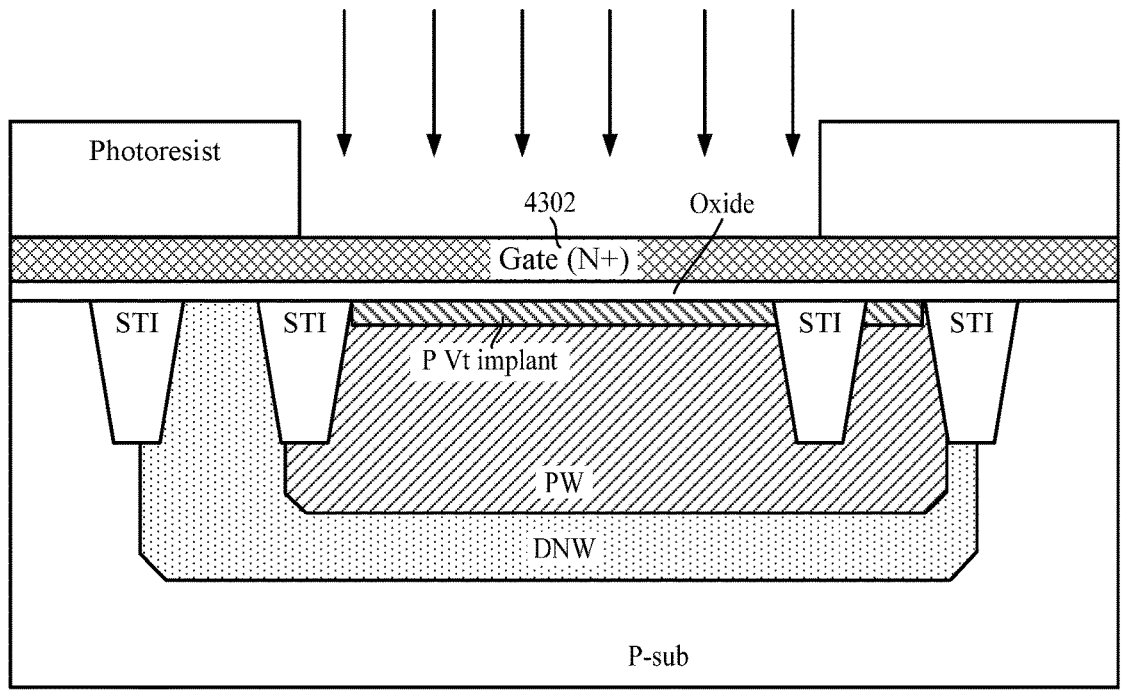
Figure 44:
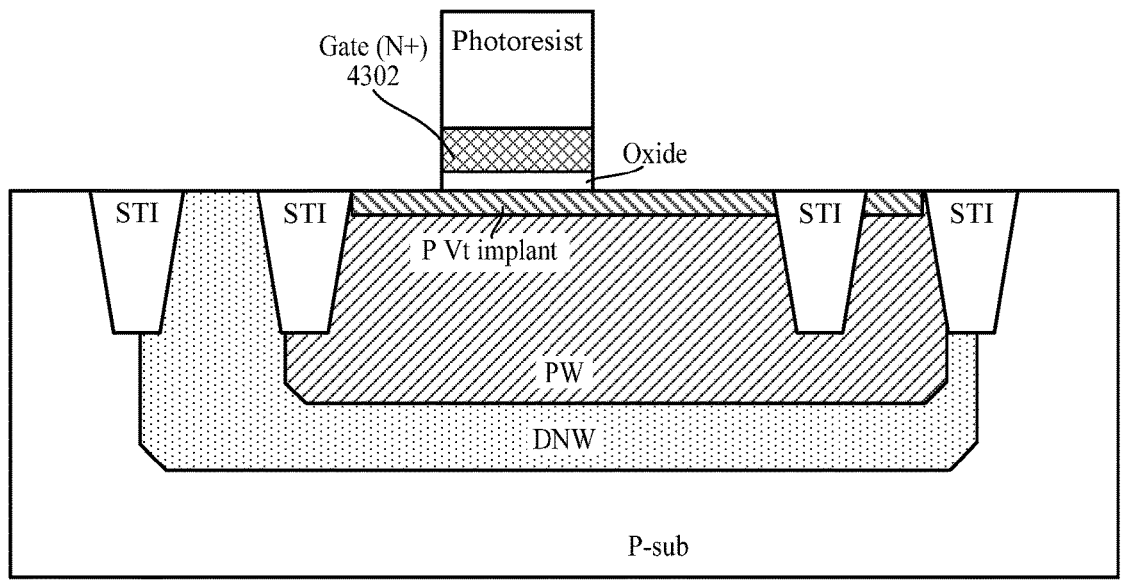
Figure 45:
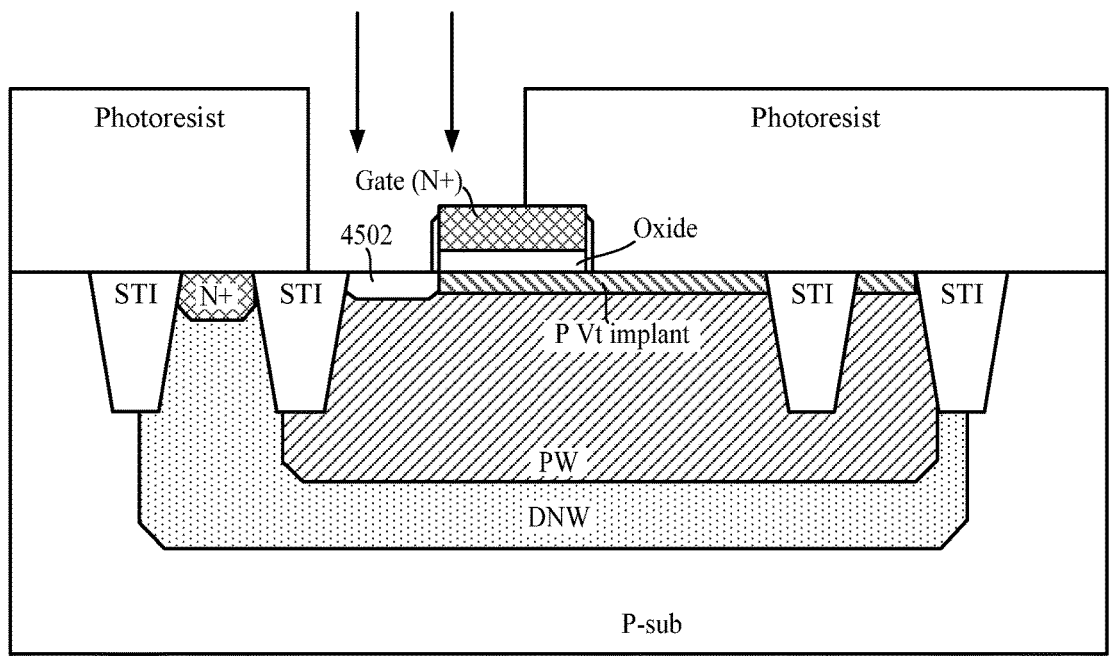

FIGS. 41-53 illustrate a process flow for fabricating a TC device having a p-doped Vt implant region, in accordance with certain aspects of the present disclosure. As illustrated in FIG. 41, after the STI regions 4102, 4104, 4106, and 4108 have been formed, a photoresist pattern may be deposited as shown, and the DNW retrograde implant region 4110 may be formed. Then a new photoresist pattern may be configured according to FIG. 42, and the PW region 4202 and the Vt implant region 4204 may be formed. This may then be followed by a thermal annealing process, as well as gate oxide growth, poly deposition, and poly dopant mask for poly N+ implantation to form the gate region 4302, as illustrated in FIG. 43. The poly dopant mask may be stripped and cleaned, poly hard mask may be deposited, and poly photo and etch patterning may be carried out, as illustrated in FIG. 44. At this point, the gate photoresist may be stripped and cleaned, followed by forming of an offset spacer, an n-type lightly doped drain (NLDD), and pocket photoresist patterning and implant, to form the n-doped region 4502, as illustrated in FIG. 45.

Figure 46:
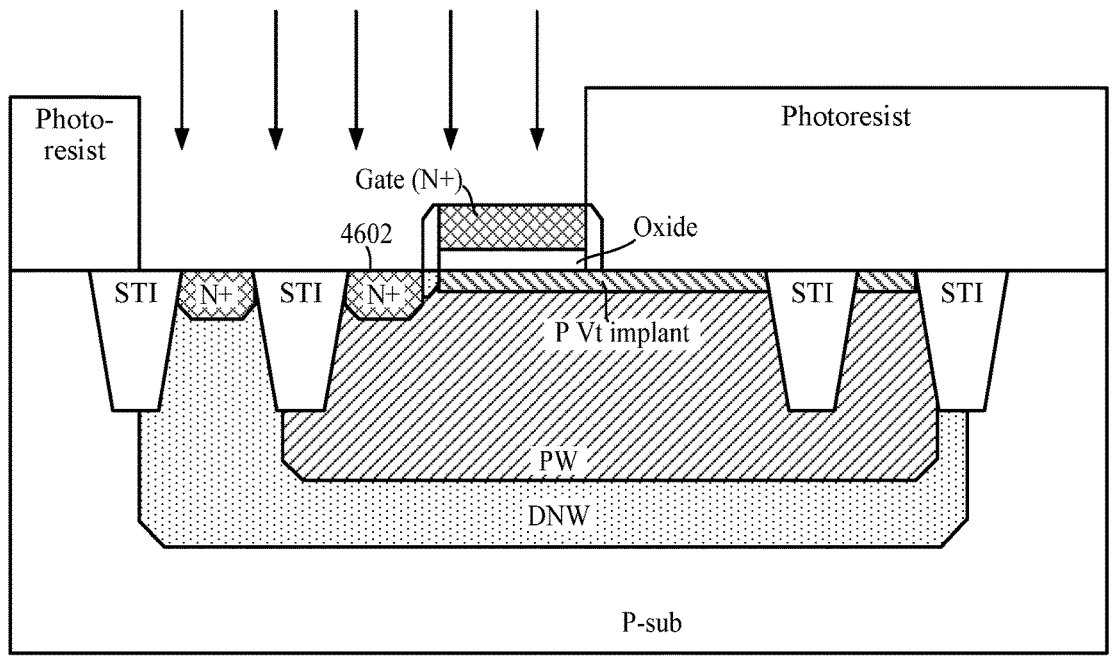
Figure 47:
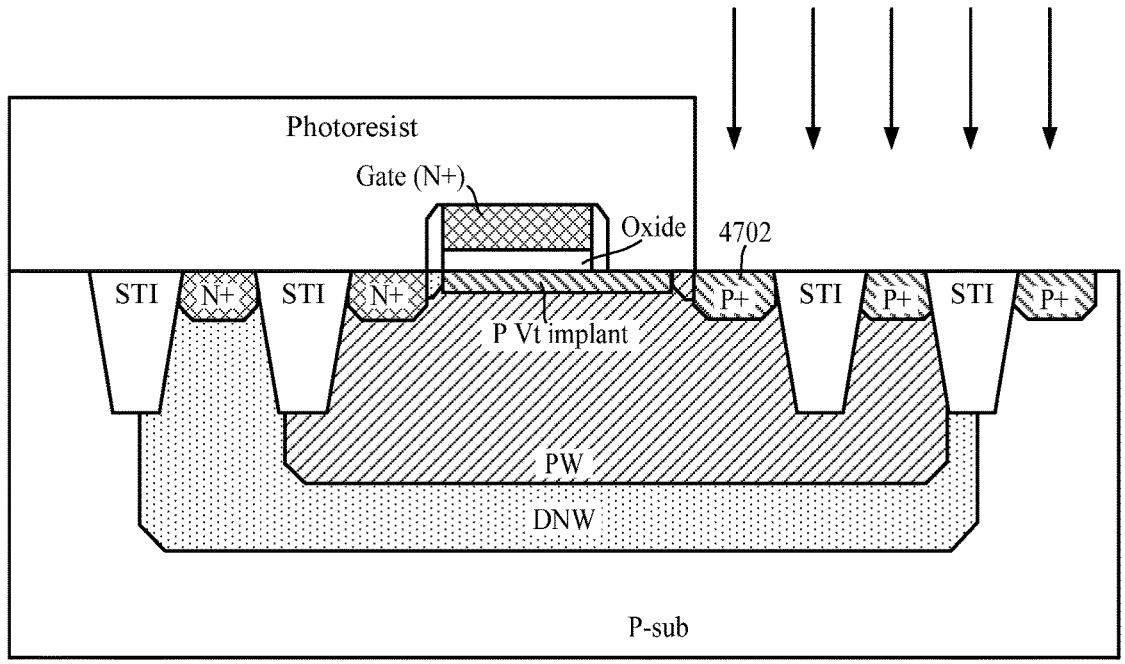
Figure 48:
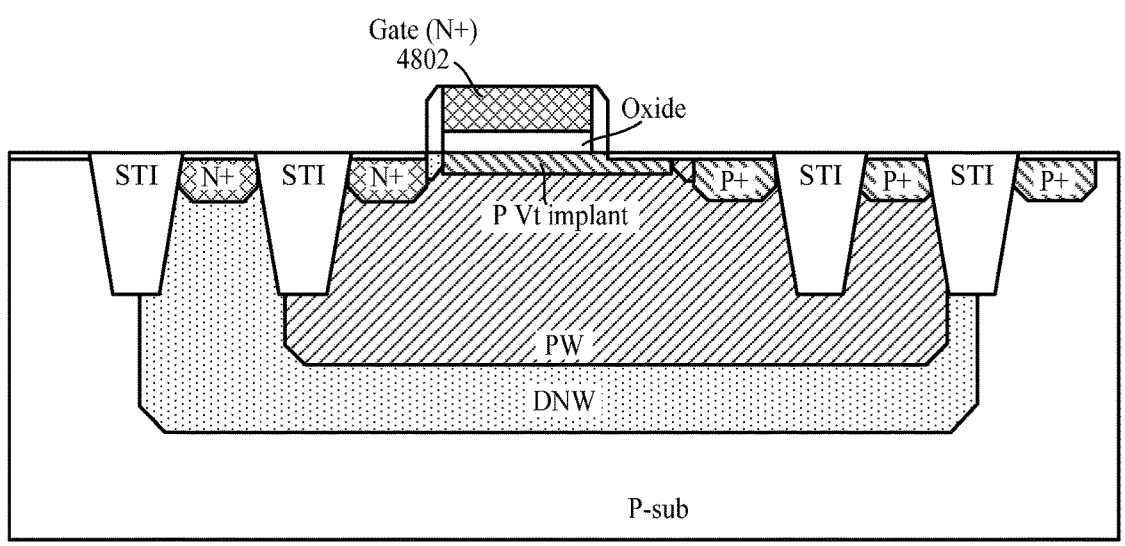

Next, the NLDD photoresist may be stripped and cleaned, SiN may be deposited, and etch back may be performed to form main spacer, followed by N+ source/drain (S/D) photoresist patterning and N+ S/D implant to form the non-insulative region 4602, as illustrated in FIG. 46. At this point, the P+ S/D photoresist may be stripped and cleaned, and the P+ S/D photoresist patterning may be carried out to form the P+ S/D implant region 4702, as illustrated in FIG. 47. The P+ S/D photoresist may then be stripped and cleaned, thermal annealing may be performed to active dopant regions, and a silicide layer 4802 may be formed on the active and gate layers, as illustrated in FIG. 48.

Figure 49:
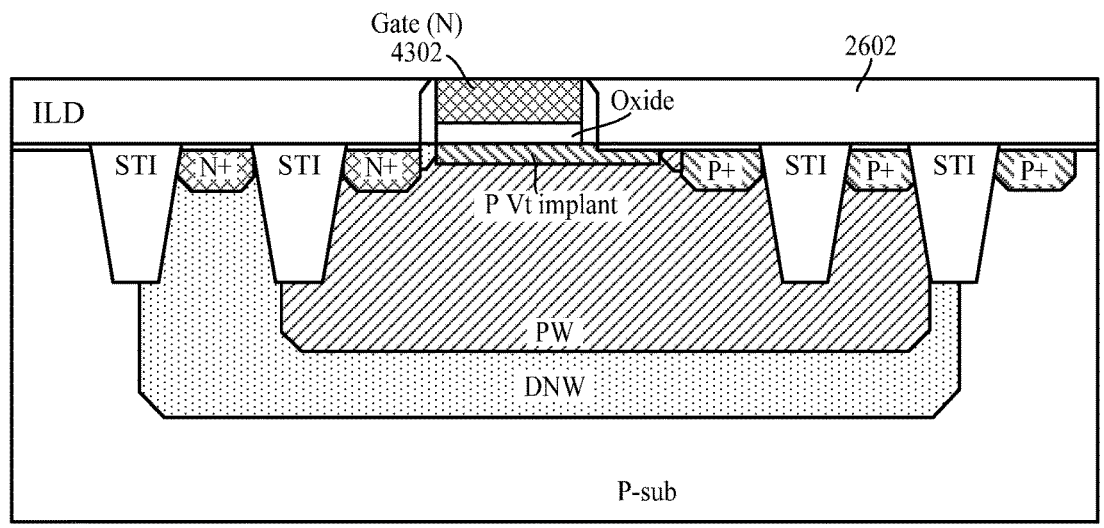
Figure 50:
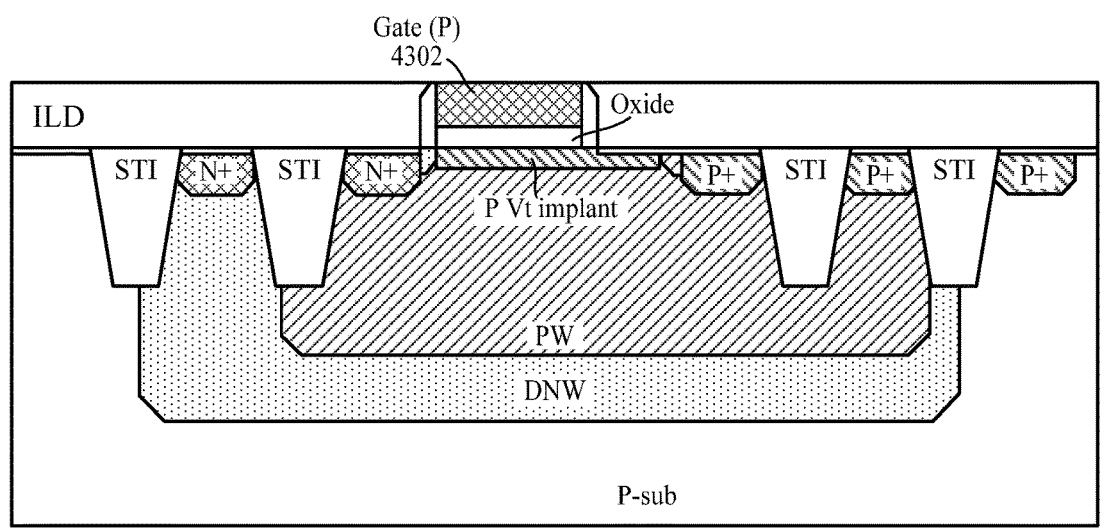

At this point, an interlayer dielectric (ILD) film 2602 may be deposited, CMP may be performed to stop on dummy poly, the N+ dummy poly material may be removed, and n-type metal gate or n-type HK/MG may be deposited, as illustrated in FIG. 49. In some cases, instead of n-type, p-type metal or p-type HK/MG may be deposited, as illustrated in FIG. 50. Moreover, CMP may be performed for the metal gate.

Figure 51:
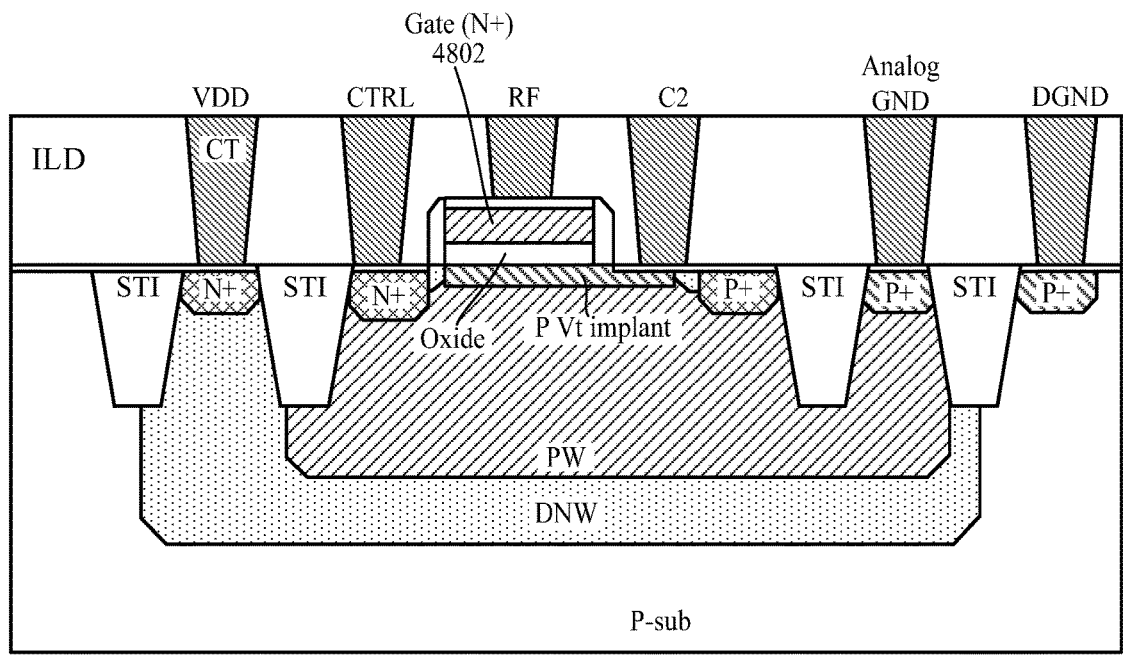
Figure 52:
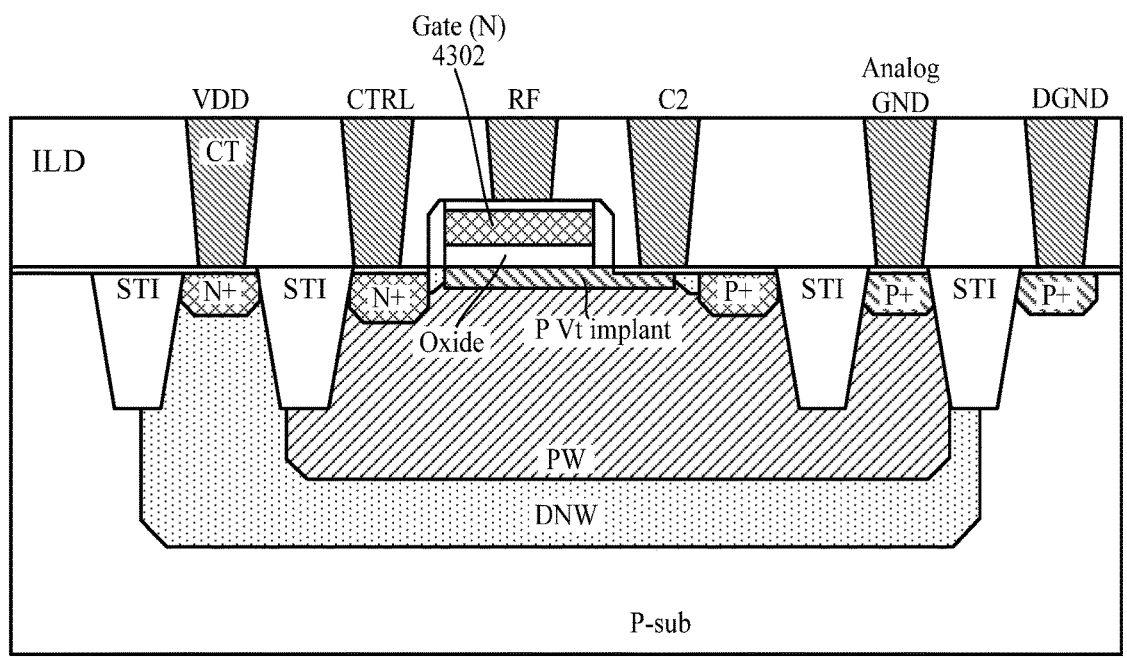
Figure 53:
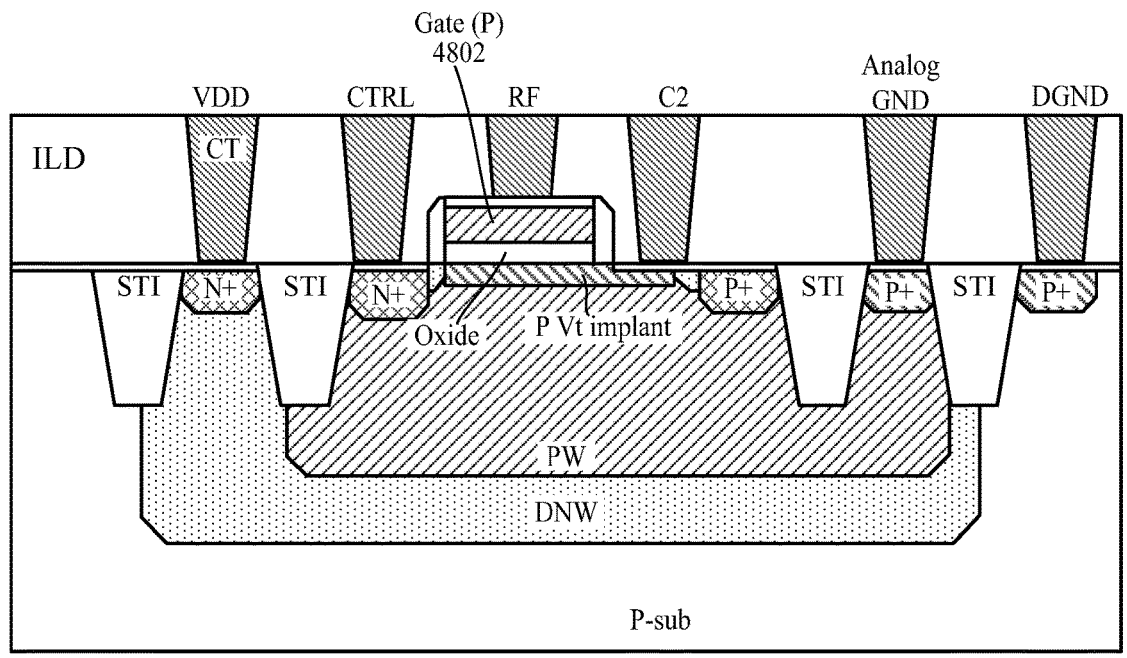

As illustrated in FIG. 51, the ILD film may be deposited, and CMP may be performed for the ILD. The CT pattern openings may be created and filled with metal material, and CMP may be performed for the CTs (i.e., terminals). The C2 CT may be located close to the gate region to reduce parasitic resistance since silicide formation may connect P+ with PW. This may be followed by BEOL processing to form metallization lines for the transcap. In some cases, the gate region 4302 may be implemented using high-k/metal gate (HK/MG) to form an n-doped gate region, as illustrated in FIG. 52, or a p-doped or p-typed metal gate region, as illustrated in FIG. 53.

Figure 54:
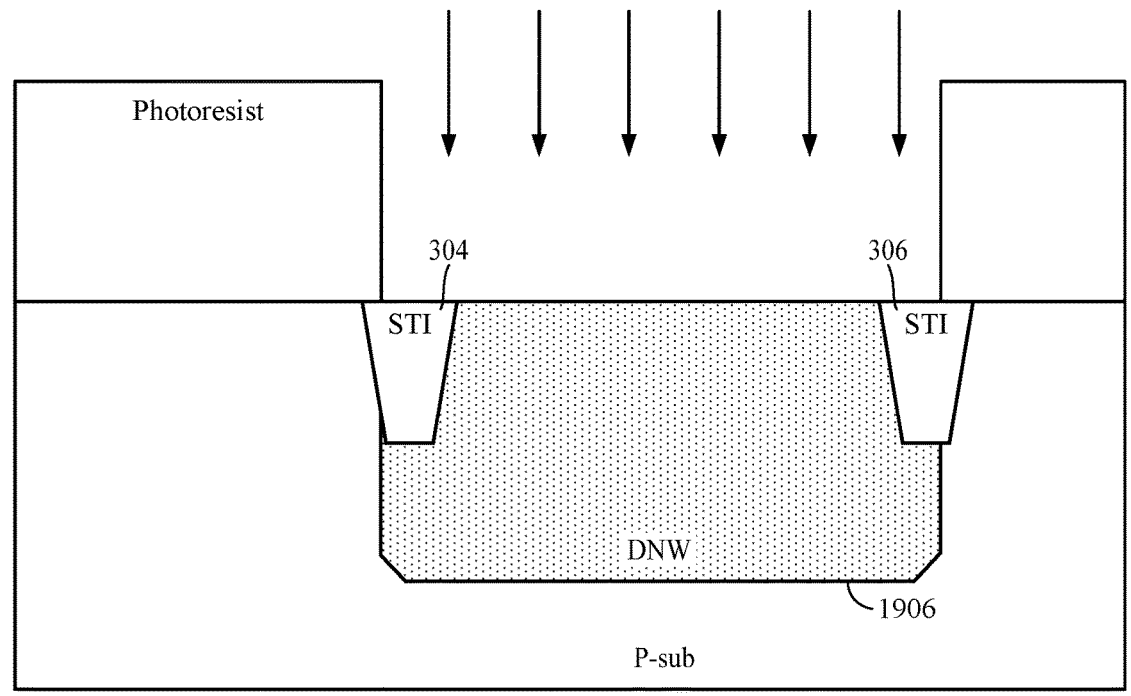
FIGS. 54-65 illustrate a process flow for fabricating a variable capacitor implemented with a threshold voltage implant region and having separate PW and NW regions, in accordance with certain aspects of the present disclosure.
Figure 55:
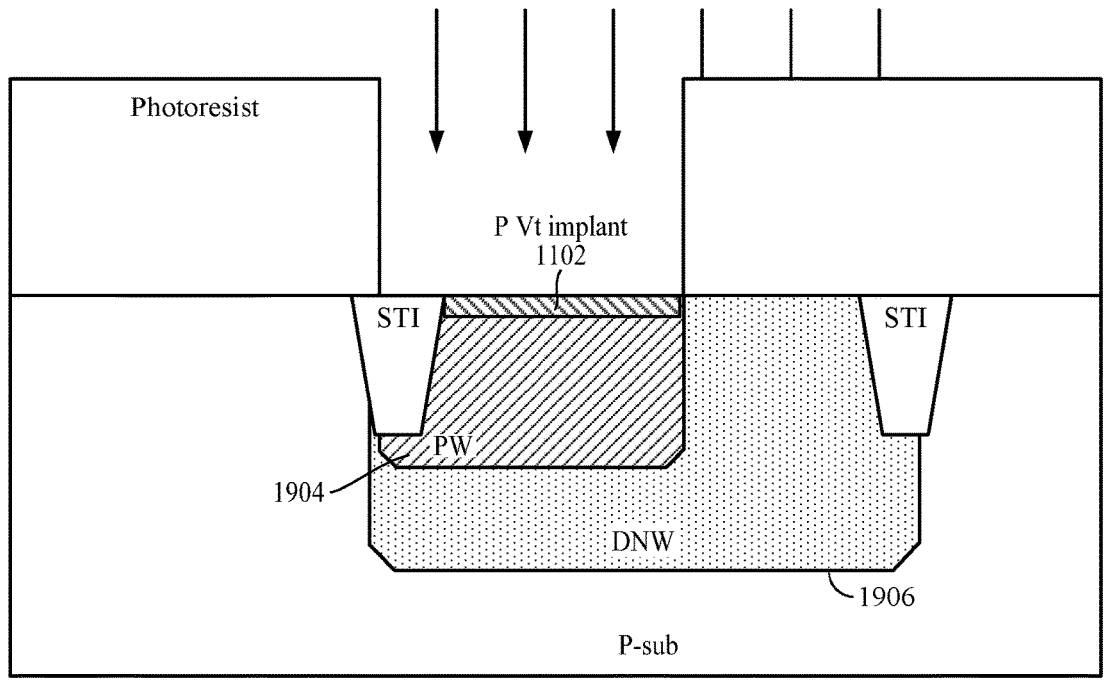
Figure 56:
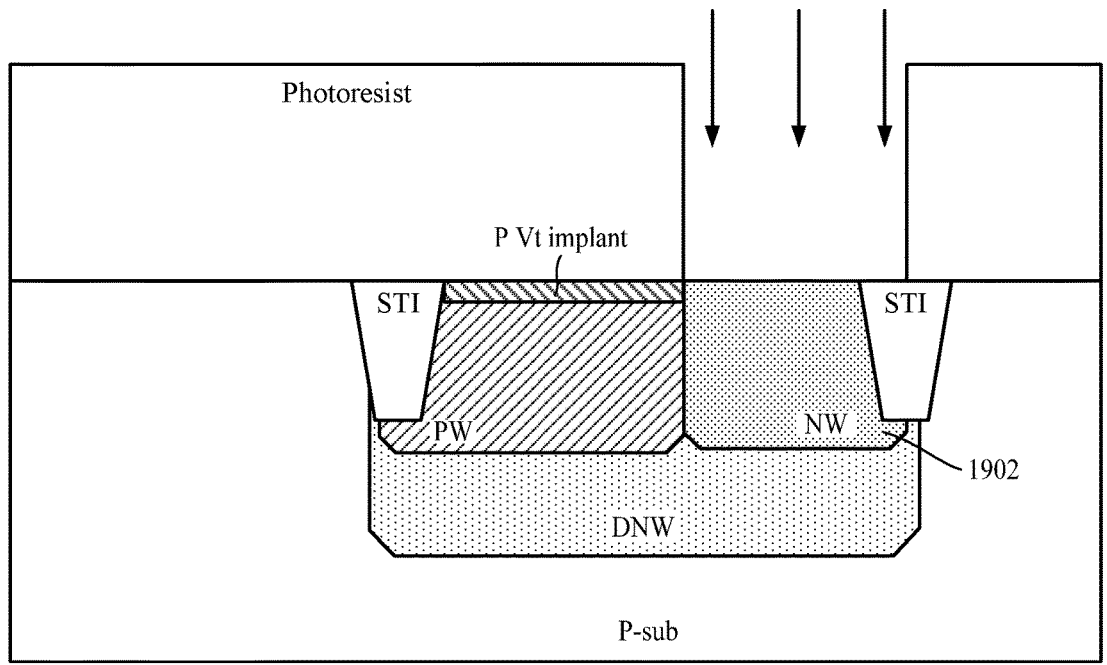
Figure 57:
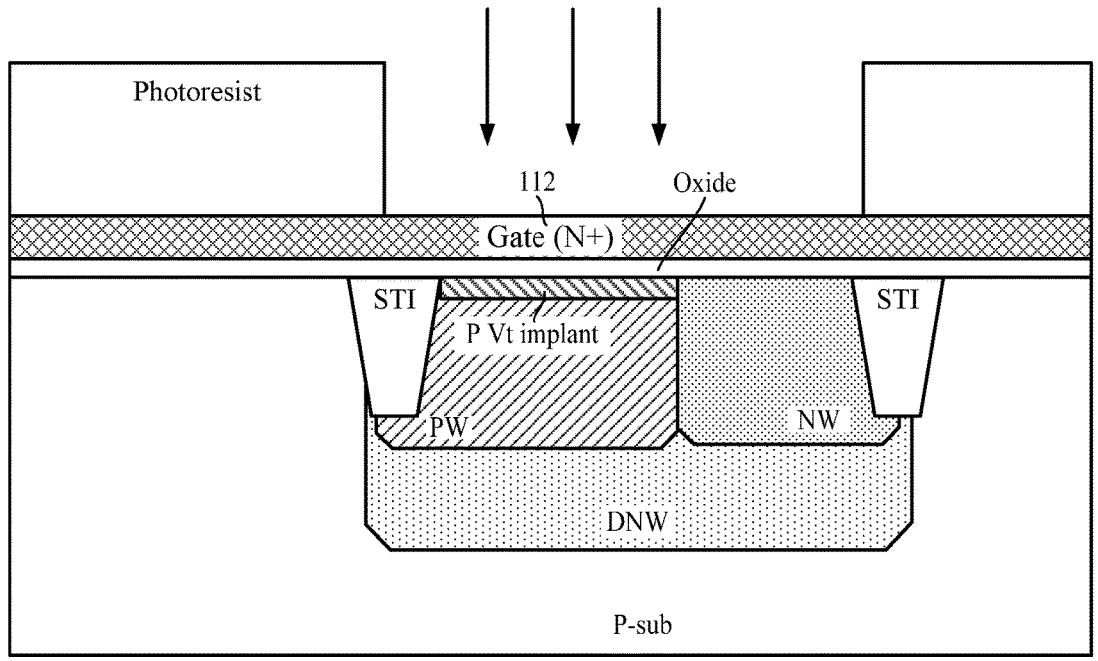

FIGS. 54-65 illustrate a process flow for fabricating the TC device of FIGS. 19 and 21, in accordance with certain aspects of the present disclosure. As illustrated in FIG. 54, after the STI regions 304 and 306 are formed, a photoresist pattern may be deposited as shown, and the DNW retrograde implant region 1906 may be formed. Then, a new photoresist pattern may be formed according to FIG. 55, and the PW region 1904 and the Vt implant region 1102 may be formed. The photoresist pattern to form the PW region 1904 may then be stripped and cleaned, and another photoresist pattern may be disposed to form the NW retrograde implant region 1902, as illustrated in FIG. 56. This may then be followed by a thermal annealing process, as well as gate oxide growth, poly deposition, and poly dopant mask for poly N+ implantation, as illustrated in FIG. 57.

Figure 58:
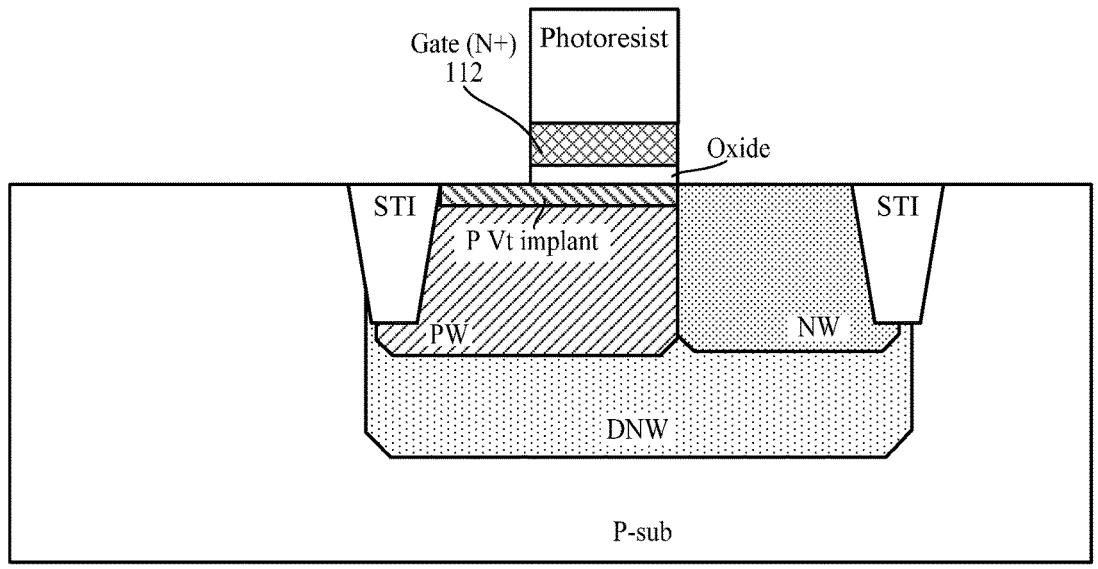
Figure 59:
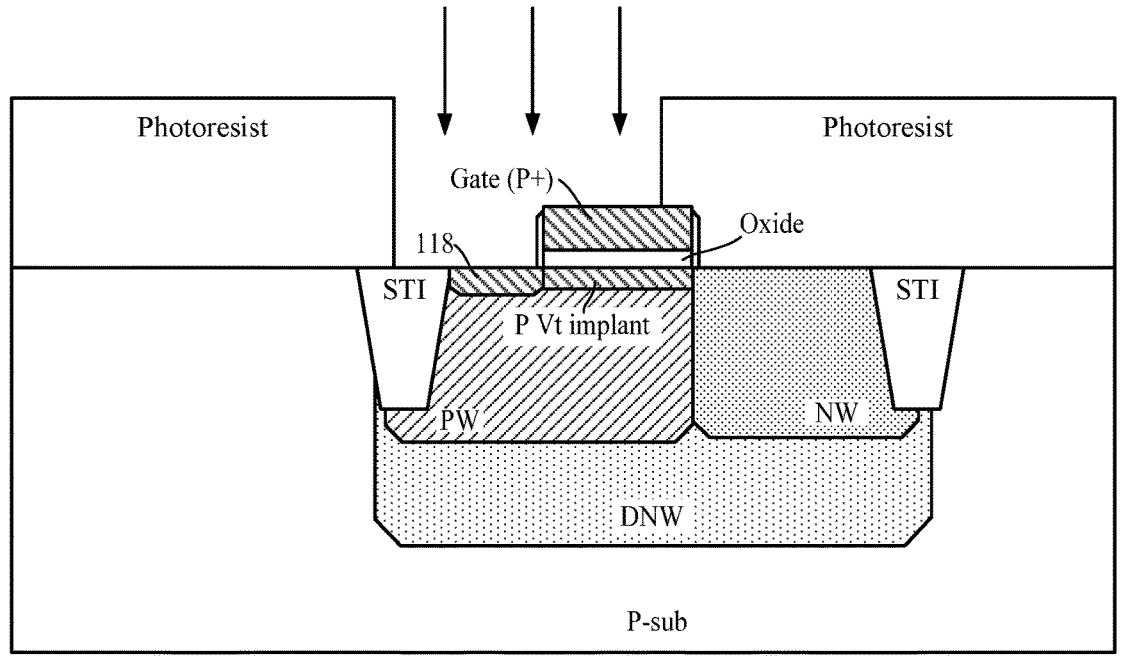
Figure 60:
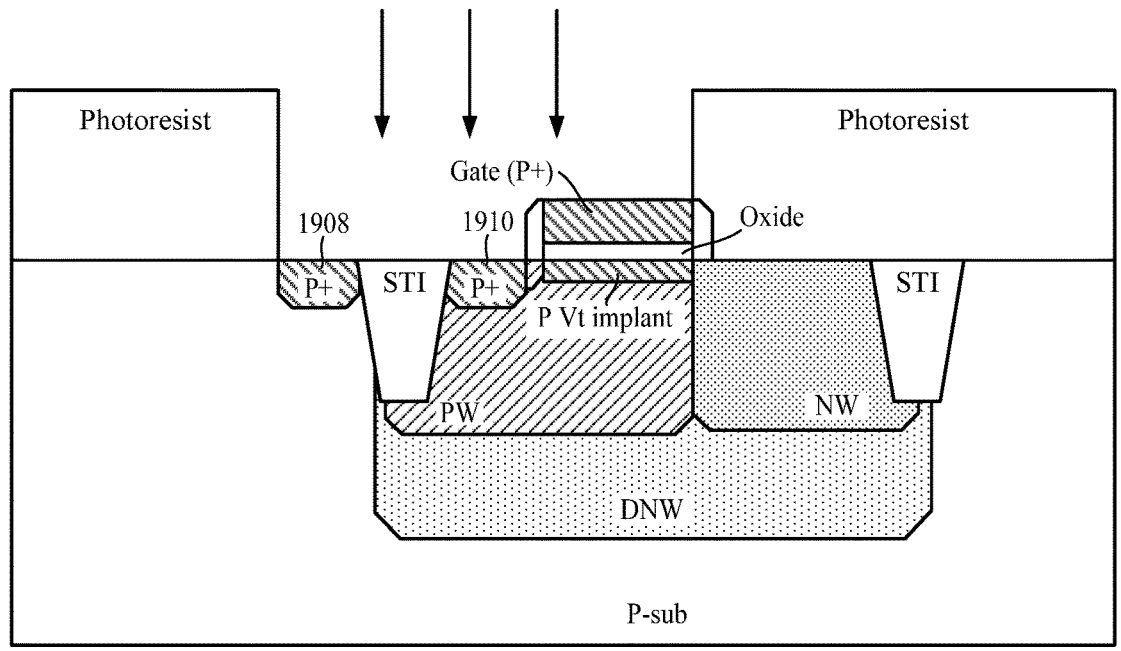

Poly dopant mask may then be stripped and cleaned, and poly hard mask may be deposited, followed by poly photo and etch patterning to form the non-insulative region 112 as illustrated in FIG. 58. At this point, the gate photoresist may be stripped and cleaned, followed by forming of an offset spacer, a p-type lightly doped drain (PLDD), and pocket photoresist patterning and implant, to form the p-doped region 118, as illustrated in FIG. 59. Next, as illustrated in FIG. 60, the PLDD photoresist may be stripped and cleaned, SiN may be deposited, and etch back may be performed to form main spacer, followed by P+ source/drain (S/D) photoresist patterning and P+ S/D implant to form the non-insulative regions 1908 and 1910 of FIG. 60.

Figure 61:
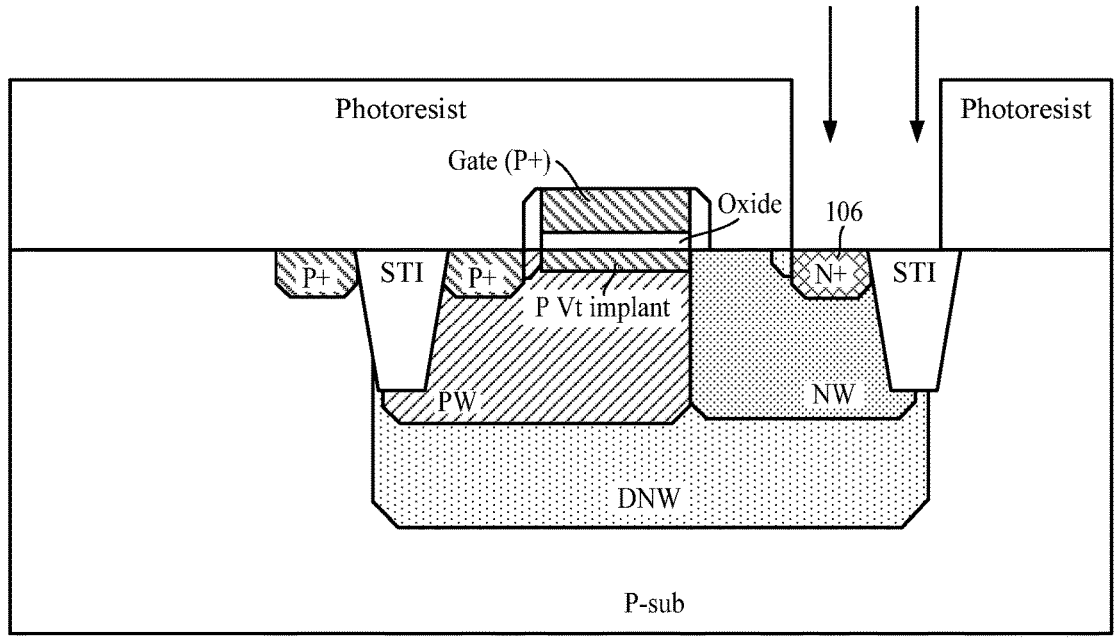
Figure 62:
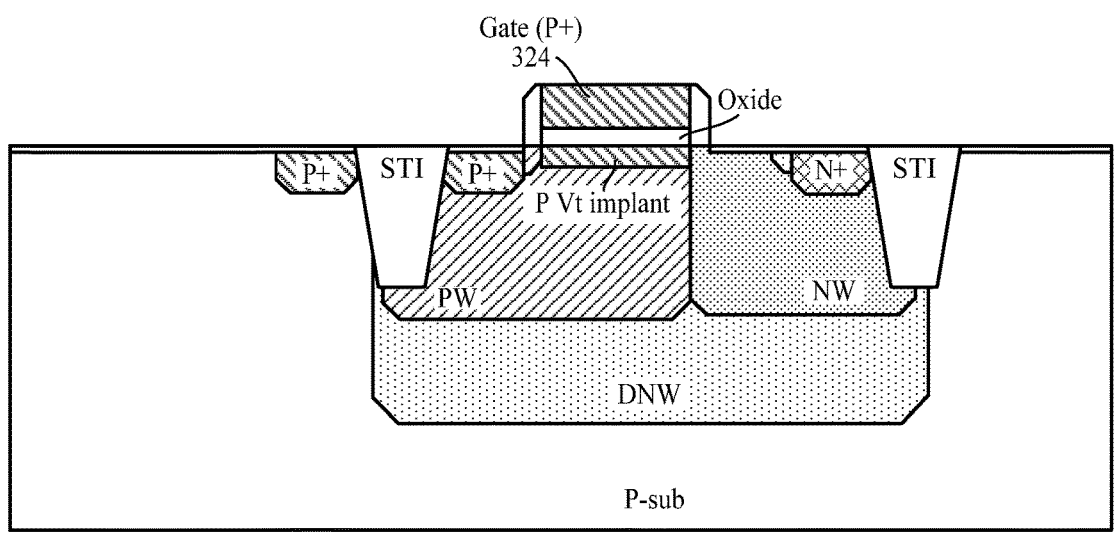
Figure 63:
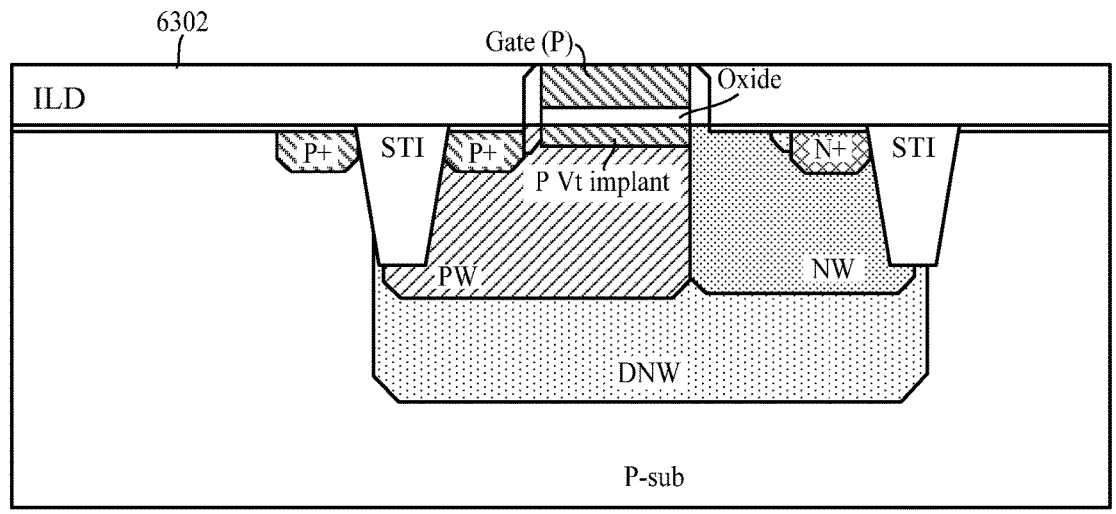
Figure 64:
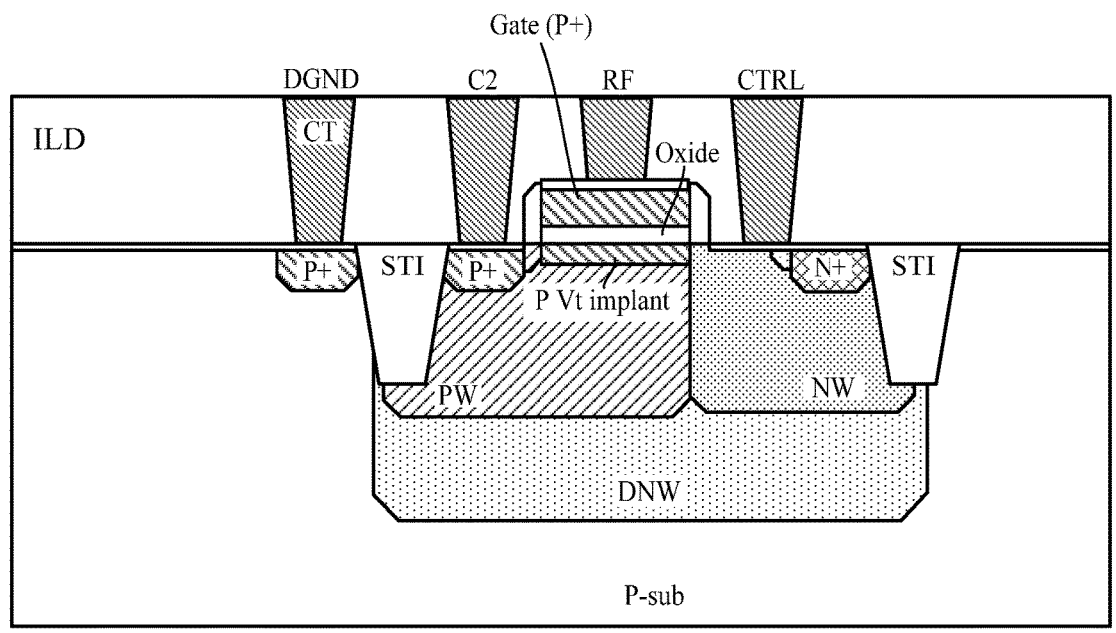
Figure 65:
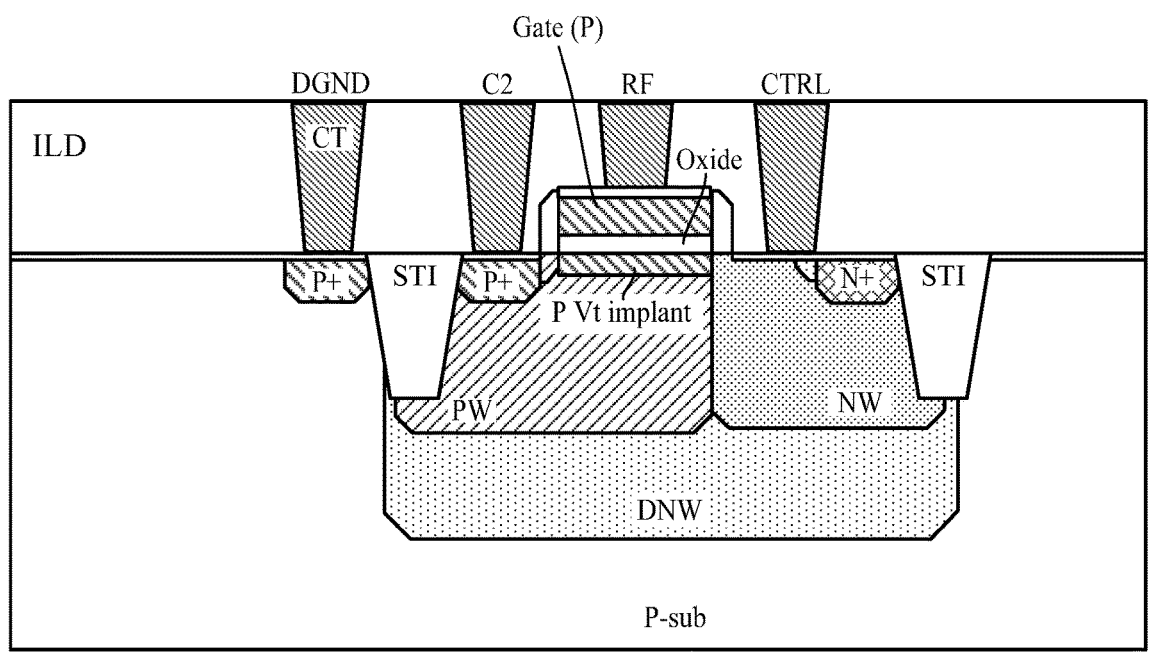

At this point, the P+ S/D photoresist may be stripped and cleaned, and the N+ S/D photoresist patterning may be carried out to form the N+ S/D implant (e.g., non-insulative region 106), as illustrated in FIG. 61. As illustrated in FIG. 62, the N+ S/D photoresist may be stripped and cleaned, thermal annealing may be performed to active dopant regions, and a silicide layer 324 may be formed on the active and gate layers. At this point, as illustrated in FIG. 63, an interlayer dielectric (ILD) film 6302 may be deposited, CMP may be performed to stop on dummy poly, the P+ dummy poly material may be removed, and p-type metal gate or p-type HK/MG may be deposited. Moreover, CMP may be performed for the metal gate. As illustrated in FIG. 64, the ILD film may be deposited, and CMP may be performed for the ILD. The CT pattern openings may be created and filled with metal material, and CMP may be performed for the CTs. The control (CTRL) CT may be fabricated close to the gate to reduce parasitic resistance since silicide form may connect N+ with NW. This may be followed by back end of line (BEOL) processing to form metallization lines for the transcap.

Figure 66:
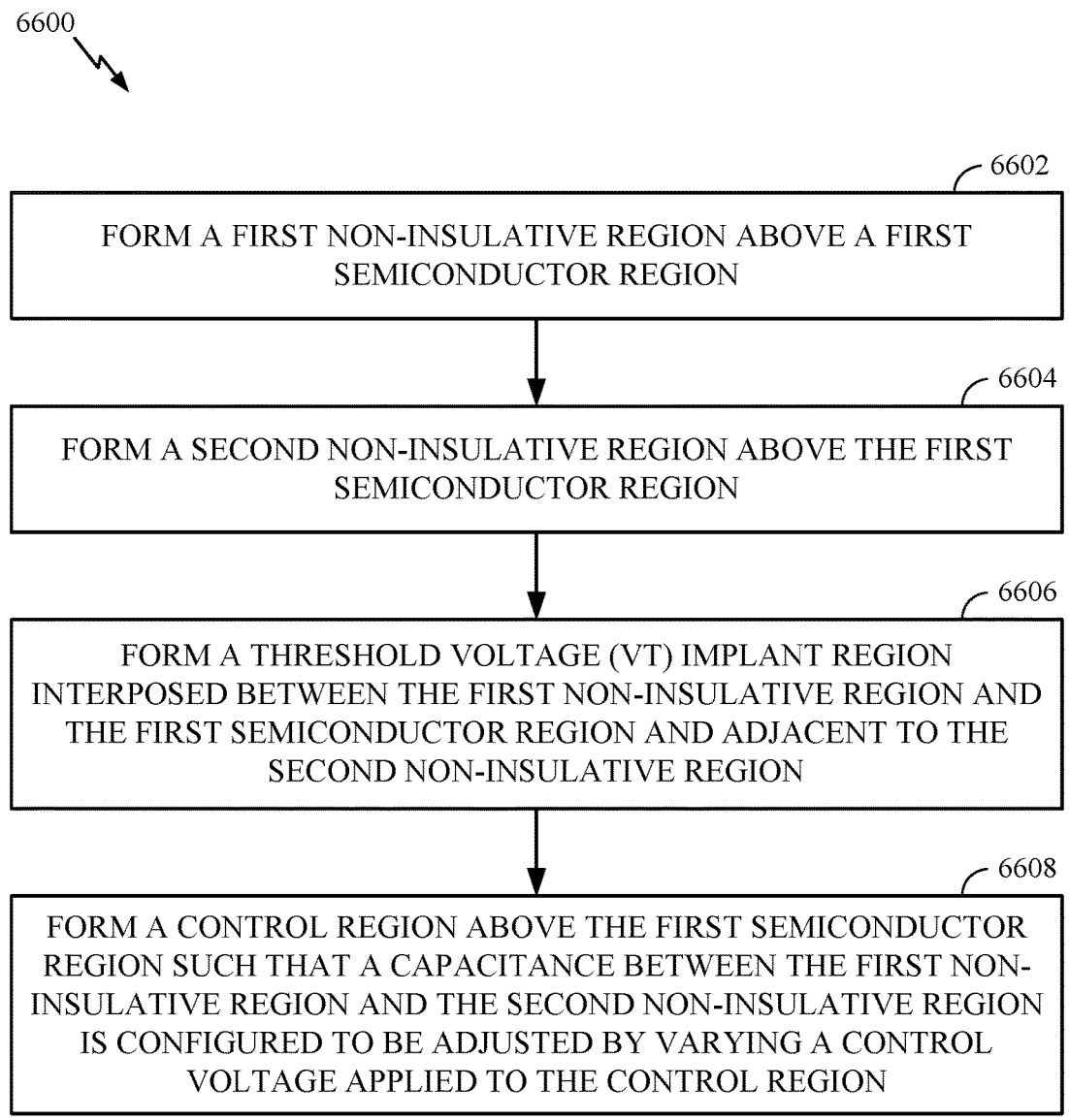
FIG. 66 is a flow diagram of example operations for fabricating a variable capacitor, in accordance with certain aspects of the present disclosure.

FIG. 66 is a flow diagram of example operations 6600 for fabricating a semiconductor variable capacitor, in accordance with certain aspects of the present disclosure. The operations 6600 may be performed, for example, by a semiconductor processing chamber.

Operations 6600 may begin, at block 6602, by forming a first non-insulative region above a first semiconductor region, and at block 6604, by forming a second non-insulative region above the first semiconductor region. Operations 6600 continue at block 6606 by forming a threshold voltage (Vt) implant region interposed between the first non-insulative region and the first semiconductor region and adjacent to the second non-insulative region. At block 6608, a control region is formed above the first semiconductor region such that a capacitance between the first non-insulative region and the second non-insulative region is configured to be adjusted by varying a control voltage applied to the control region.

Figure 67:
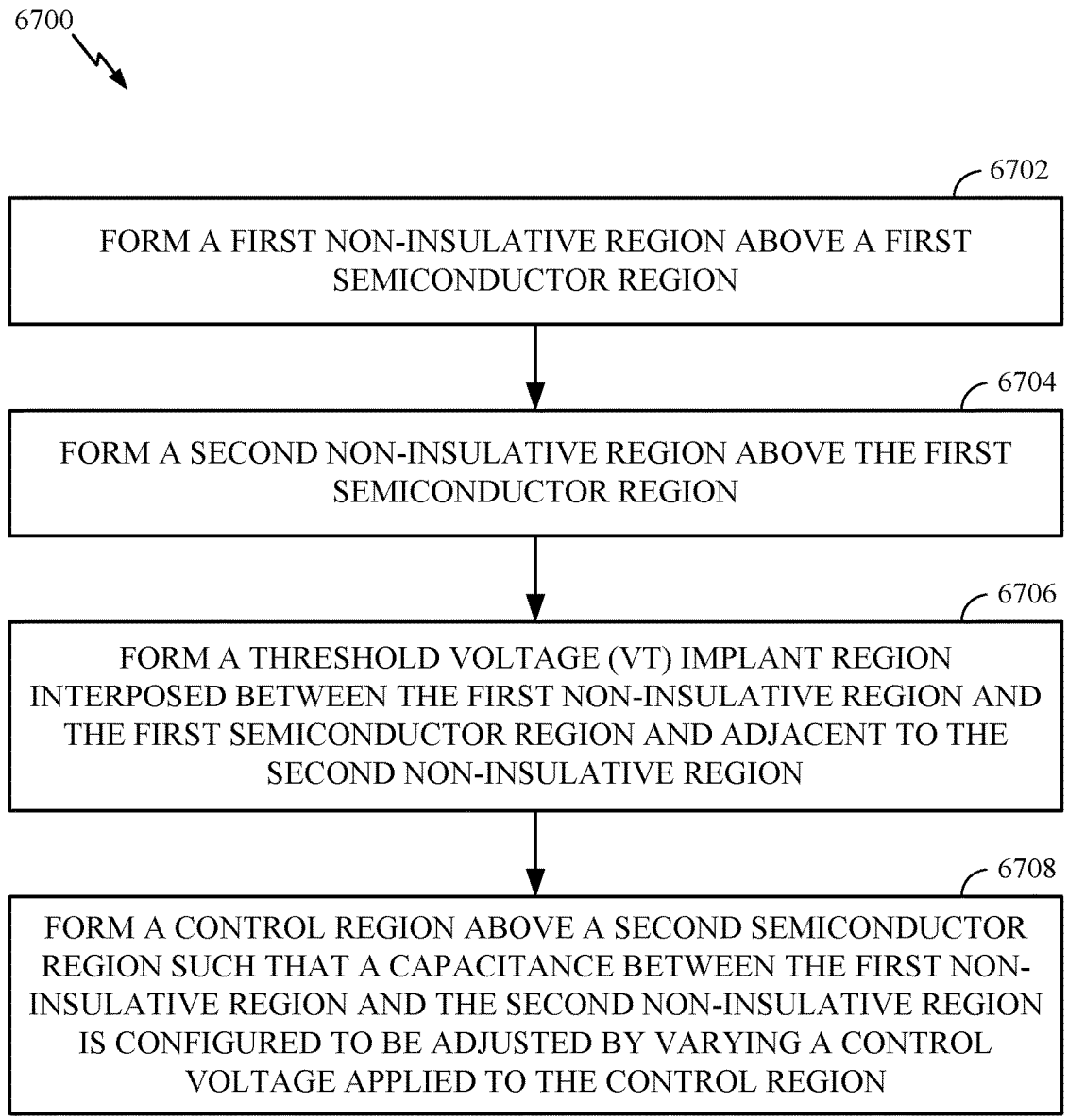
FIG. 67 is a flow diagram of example operations for fabricating a variable capacitor implemented with separate PW and NW regions, in accordance with certain aspects of the present disclosure.

FIG. 67 is a flow diagram of example operations 6700 for fabricating a semiconductor variable capacitor, in accordance with certain aspects of the present disclosure. The operations 6700 may be performed, for example, by a semiconductor processing chamber.

The operations 6700 begin, at block 6702, by forming a first non-insulative region above a first semiconductor region, and at block 6704, by forming a second non-insulative region above the first semiconductor region. At block 6706, the operations 6700 continue by forming a Vt implant region interposed between the first non-insulative region and the first semiconductor region and adjacent to the second non-insulative region. At block 6708, a control region is formed above a second semiconductor region such that a capacitance between the first non-insulative region and the second non-insulative region is configured to be adjusted by varying a control voltage applied to the control region.

Aspects of the present disclosure provide several advantages. For example, aspects of the present disclosure provide a CMOS-compatible process to implement (e.g., fabricate) a TC device, as illustrated in FIGS. 27-65. Moreover, using separate PW and NW regions as illustrated in FIGS. 19-26 allow for a large depletion thickness, increasing the TC's tuning range, and avoids PW and NW counter dopant issues.

In addition, using n-doped or p-doped Vt implant regions, reduces the surface resistance of the TC device, and increases the TC devices' Q. Moreover, placing the C2 terminal close to the gate region as described with respect to FIG. 3 also reduces the series resistance of the TC device. Aspects of the present disclosure also use N+ or P+ doped, or N or P type metal gate regions for NW or PW TC devices, which reduces the gate depletion of the TC devices. Certain aspects of the present disclosure also provide TC devices that can be scaled with HK/MG and fin field-effect transistor (finFET) technologies.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules and circuits described in connection with the present disclosure may be implemented or performed with a general purpose processor, a digital signal processor (DSP), an ASIC, a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the physical (PHY) layer. In the case of a user terminal, a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further.

The processing system may be configured as a general-purpose processing system with one or more microprocessors providing the processor functionality and external memory providing at least a portion of the machine-readable media, all linked together with other supporting circuitry through an external bus architecture. Alternatively, the processing system may be implemented with an ASIC with the processor, the bus interface, the user interface in the case of an access terminal), supporting circuitry, and at least a portion of the machine-readable media integrated into a single chip, or with one or more FPGAs, PLDs, controllers, state machines, gated logic, discrete hardware components, or any other suitable circuitry, or any combination of circuits that can perform the various functionality described throughout this disclosure. Those skilled in the art will recognize how best to implement the described functionality for the processing system depending on the particular application and the overall design constraints imposed on the overall system.

It is to be understood that the claims are not limited to the precise configuration and components illustrated above. Various modifications, changes and variations may be made in the arrangement, operation and details of the methods and apparatus described above without departing from the scope of the claims.

What is claimed is:
1. A semiconductor variable capacitor comprising:
   a first non-insulative region disposed in a gate region above a first semiconductor region;
   a second non-insulative region disposed above the first semiconductor region;

a threshold voltage (Vt) implant region interposed between the first non-insulative region and the first semiconductor region and disposed adjacent to the second non-insulative region; and a control region disposed above the first semiconductor region such that a capacitance between the first non-insulative region and the second non-insulative region is configured to be adjusted by varying a control voltage applied to the control region, wherein the first semiconductor region is a retrograde well formed on a semiconductor substrate, and wherein the Vt implant region is disposed directly on the first semiconductor region and has a same doping type as the first semiconductor region.

2. The semiconductor variable capacitor of claim 1, wherein the second non-insulative region and the control region have different doping types.

3. The semiconductor variable capacitor of claim 1, wherein the Vt implant region comprises the same doping type as the second non-insulative region.

4. The semiconductor variable capacitor of claim 3, wherein the first non-insulative region comprises the same doping type as the second non-insulative region.

5. The semiconductor variable capacitor of claim 1, further comprising a second semiconductor region disposed below the first semiconductor region, wherein the second semiconductor region comprises a different doping type than the first semiconductor region.

6. The semiconductor variable capacitor of claim 5, further comprising a third semiconductor region disposed below the second semiconductor region, wherein the third semiconductor region comprises a different doping type than the second semiconductor region.

7. The semiconductor variable capacitor of claim 6, wherein the second semiconductor region is coupled to a ground terminal and wherein the third semiconductor region is coupled to a power supply terminal.

8. The semiconductor variable capacitor of claim 6, further comprising a shallow trench isolation (STI) region disposed between the second semiconductor region and the control region, wherein the second semiconductor region is electrically coupled to the control region.

9. The semiconductor variable capacitor of claim 6, further comprising a substrate layer disposed below the third semiconductor region, wherein the substrate layer comprises a different doping type than the third semiconductor region and wherein the substrate layer is coupled to a ground terminal.

10. The semiconductor variable capacitor of claim 1, further comprising a terminal coupled to and disposed above a surface of the second non-insulative region and disposed above a surface of a portion of the Vt implant region extending beyond the first non-insulative region.

11. The semiconductor variable capacitor of claim 1, further comprising a shallow trench isolation (STI) region disposed above the first semiconductor region and disposed between a second semiconductor region and the Vt implant region.

12. The semiconductor variable capacitor of claim 1, further comprising:
a third non-insulative region disposed above the first semiconductor region;
another Vt implant region interposed between the third non-insulative region and the first semiconductor region and disposed adjacent to the second non-insulative region; and another control region disposed above the first semiconductor region such that a capacitance between the third non-insulative region and the second non-insulative region is configured to be adjusted by varying another control voltage applied to the other control region.

13. The semiconductor variable capacitor of claim 12, wherein the Vt implant region and the other Vt implant region comprise the same doping type as the second non-insulative region.

14. The semiconductor variable capacitor of claim 13, wherein the first non-insulative region comprises the same doping type as the third non-insulative region, but a different doping type than the second non-insulative region.

15. The semiconductor variable capacitor of claim 1, further comprising:
a third non-insulative region disposed above the first semiconductor region;
a fourth non-insulative region disposed above the first semiconductor region; and
another Vt implant region interposed between the third non-insulative region and the first semiconductor region and disposed adjacent to the fourth non-insulative region, such that a capacitance between the third non-insulative region and the fourth non-insulative region is configured to be adjusted by varying a voltage applied between the control region and the fourth non-insulative region.

16. The semiconductor variable capacitor of claim 15, wherein the Vt implant region and the other Vt implant region comprise the same doping type as the second non-insulative region and the fourth non-insulative region.

17. The semiconductor variable capacitor of claim 16, wherein the first non-insulative region comprises the same doping type as the third non-insulative region, the second non-insulative region, and the fourth non-insulative region.

18. A semiconductor variable capacitor comprising:
a first non-insulative region disposed in a gate region above a first semiconductor region;
a second non-insulative region disposed above the first semiconductor region;
a threshold voltage (Vt) implant region interposed between the first non-insulative region and the first semiconductor region and disposed adjacent to the second non-insulative region; and
a control region disposed above a second semiconductor region such that a capacitance between the first non-insulative region and the second non-insulative region is configured to be adjusted by varying a control voltage applied to the control region,
wherein the first semiconductor region is a retrograde well formed on a semiconductor substrate, and
wherein the Vt implant region is disposed directly on the first semiconductor region and has a same doping type as the first semiconductor region.

19. The semiconductor variable capacitor of claim 18, wherein the second semiconductor region is disposed adjacent to the first semiconductor region and wherein the first semiconductor region has a different doping type than the second semiconductor region to form a depletion region therebetween.

20. The semiconductor variable capacitor of claim 19, wherein the Vt implant region is disposed between the second non-insulative region and the depletion region.

21. The semiconductor variable capacitor of claim 18, wherein the second non-insulative region and the control region have different doping types.

22. The semiconductor variable capacitor of claim 18, wherein the Vt implant region comprises the same doping type as the second non-insulative region.

23. The semiconductor variable capacitor of claim 22, wherein the first non-insulative region and the second non-insulative region have different doping types.

24. The semiconductor variable capacitor of claim 18, further comprising a third semiconductor region disposed below at least the first semiconductor region or the second semiconductor region, wherein the third semiconductor region comprises a different doping type than the first semiconductor region.

25. The semiconductor variable capacitor of claim 24, further comprising a substrate layer disposed below the third semiconductor region, wherein the substrate layer comprises a different doping type than the third semiconductor region and wherein the substrate layer is coupled to a ground terminal.

26. The semiconductor variable capacitor of claim 18, further comprising a shallow trench isolation (STI) region disposed above the second semiconductor region and disposed between the control region and the Vt implant region.

27. The semiconductor variable capacitor of claim 18, further comprising:
a third non-insulative region disposed above a third semiconductor region;
a fourth non-insulative region disposed above the third semiconductor region; and
another Vt implant region interposed between the third non-insulative region and the third semiconductor region and disposed adjacent to the fourth non-insulative region, such that a capacitance between the third non-insulative region and the fourth non-insulative region is configured to be adjusted by varying a voltage applied between the control region and the fourth non-insulative region.

28. The semiconductor variable capacitor of claim 18, further comprising:
a third non-insulative region disposed above the first semiconductor region;
another Vt implant region interposed between the third non-insulative region and the first semiconductor region and disposed adjacent to the second non-insulative region; and
another control region disposed above a third semiconductor region such that a capacitance between the third non-insulative region and the second non-insulative region is configured to be adjusted by varying another control voltage applied to the other control region.

* * * * *